United States Patent
Saito et al.

(10) Patent No.: US 8,149,906 B2
(45) Date of Patent: Apr. 3, 2012

(54) DATA TRANSFER BETWEEN CHIPS IN A MULTI-CHIP SEMICONDUCTOR DEVICE WITH AN INCREASED DATA TRANSFER SPEED

(75) Inventors: Hideaki Saito, Minato-ku (JP); Hiroaki Ikeda, Chuo-ku (JP)

(73) Assignees: NEC Corporation, Tokyo (JP); Elpida Memory, Inc, Tokyo (JP)

( * ) Notice: Subject to any disclaimer, the term of this patent is extended or adjusted under 35 U.S.C. 154(b) by 642 days.

(21) Appl. No.: 12/323,922

(22) Filed: Nov. 26, 2008

(65) Prior Publication Data

US 2009/0141827 A1 Jun. 4, 2009

(30) Foreign Application Priority Data

Nov. 30, 2007 (JP) ................................ 2007-310921

(51) Int. Cl.
*H04B 1/38* (2006.01)
(52) U.S. Cl. ........................................ 375/224; 375/258
(58) Field of Classification Search .................. 375/224, 375/213, 257, 258
See application file for complete search history.

(56) References Cited

U.S. PATENT DOCUMENTS

| | | | |
|---|---|---|---|
| 2003/0151134 A1* | 8/2003 | Nishizawa et al. | 257/723 |
| 2004/0150008 A1* | 8/2004 | Preisach | 257/203 |

* cited by examiner

*Primary Examiner* — Emmanuel Bayard
(74) *Attorney, Agent, or Firm* — Sughrue Mion, PLLC

(57) ABSTRACT

A data transfer method is disclosed in a multi-chip semiconductor device which comprises a plurality of inter-chip wires. First, a test is conducted to determine whether or not each inter-chip wire is capable of normally transferring data, on circuits arranged on chips between which the inter-chip wire is connected. When an inter-chip wire incapable of normally transferring data exists, the data transfer speed of the buffer circuit that is on the chip on the transmission and that is connected to an inter-chip wire capable of normally transferring data is increased. The buffer circuit, whose data transfer speed has been increased, transfers data which would otherwise be transferred through the inter-chip wire incapable of normally transferring data, together with the data which should be transferred thereby, to the chip on the reception side chip through an inter-chip wire connected to the buffer circuit at the data transfer speed.

25 Claims, 24 Drawing Sheets

DATA TRANSFER BETWEEN CHIPS IN A MULTI-CHIP SEMICONDUCTOR DEVICE WITH AN INCREASED DATA TRANSFER SPEED

This application is based upon and claims the benefit of priority from Japanese patent application No. 2007-310921 filed on Nov. 30, 2007, the disclosure of which is incorporated herein in its entirety by reference.

BACKGROUND OF THE INVENTION

1. Field of the Invention

The present invention relates to a multi-chip semiconductor device which comprises two or more semiconductor chips, and a plurality of inter-chip wires for transferring data in synchronization with a clock signal between the semiconductor chips, and more particularly, to a method of transferring data between the chips.

2. Description of the Related Art

Miniaturization of semiconductor integrated circuits has improved the density of integration, and promotes higher performance of CPU and larger memory capacities. However, since miniaturization of semiconductor integrated circuits has limitations, the introduction of new technologies has been needed for further increasing the density of integration. As one such technology, there is a semiconductor device, called a system-in-package or a multi-chip package, which comprises a multi-chip having laminated semiconductor chips within a package. In these semiconductor devices, although chips are interconnected through bonding wires, the number of wires is limited to approximately one hundred. Thus, in order to further increase the number of wires between chips, a through-wire has been proposed to increase the wiring density by passing wires through semiconductor substrates of chips from the front surface to the back surface. K. Takahashi et al., Japanese Journal of Applied Physics, 40, 3032 (2001) has proposed to reduce the thickness of an Si substrate of a semiconductor chip to 50 µm, piercing a hole of 10 µm square extending through the substrate from the front surface to the back surface, and filling the hole with a metal to form a through wire for inter-chip wiring. This through wiring enables inter-chip wires to be routed on the surface of a chip two-dimensionally to accomplish even several thousands of inter-chip wires.

If the number of inter-chip wires increases to several thousands due to through wiring, even 1% of faulty through wires means that there will be essentially no good lamination type semiconductor devices. Thus, spare inter-chip wires are provided for purposes of redundancy, and are used to transfer data to be transferred through a faulty inter-chip so that the total amount of data to be transferred between chips is not reduced. However, if the number of faulty inter-chip wires increases by several tens of percent, the total number of inter-chip wires also increases by several tens of percent due to the spare inter-chip wires. For example, if there are 5,000 inter-chip wires and the percent defective is 10%, then at least 500 spare inter-chip wires are required. This results in an area overhead of 1.25 mm² in a chip surface if the inter-chip wiring employs through wires with a wiring pitch of 50 µm. In spite of a semiconductor device being multi-layered to increase the density of semiconductor circuits, the area occupied by the spare inter-chip wires can limit improvement in the density of semiconductor circuits.

JP2002-334600A discloses a semiconductor integrated circuit wherein two groups of semiconductor integrated circuits are provided and when one bus group fails, outputs from a non-volatile memory are switched to the other bus group. JP2004-118987A discloses conducting diagnosis on memory cells in a semiconductor integrated circuit device as to which memory cell(s) is/are faulty. It is to be noted that in any of the inventions described in these patent documents, the target of the test is not inter-chip wires.

SUMMARY OF THE INVENTION

It is an object of the present invention to provide a method of transferring data between chips and a multi-chip semiconductor device which are capable of preventing a reduction in the amount of data to be transferred between chips, without increasing the total number of inter-chip wires, when a faulty inter-chip wire(s) is/are encountered.

First, a test is conducted to determine whether or not each inter-chip wire is capable of normally transferring data, on circuits arranged on chips between which the inter-chip wire is connected. When there exists an inter-chip wire incapable of normally transferring data, the data transfer speed of a buffer circuit on a chip on the transmission side which is connected to an inter-chip wire capable of normally transferring data, is increased. The buffer circuit, whose data transfer speed has been increased, transfers data to be transferred through the inter-chip wire which is incapable of normally transferring data, together with data which should originally be transferred by the buffer circuit, to a chip on the reception side through an inter-chip wire connected to the buffer circuit, at the increased data transfer speed.

Thus, the present invention makes it possible to avoid a reduction in bandwidth for data transfer between chips when there exist(s) an inter-chip wire(s) having a faulty connection in a multi-chip semiconductor device, because the speed of data transfer through another inter-chip wire is increased, and this inter-chip wire is used to transfer data which should otherwise be transferred through the inter-chip wire having a faulty connection.

The above and other objects, features and advantages of the present invention will become apparent from the following description with reference to the accompanying drawings which illustrate examples of the present invention.

EXEMPLARY EMBODIMENTS

First Exemplary Embodiment

Figure 1:
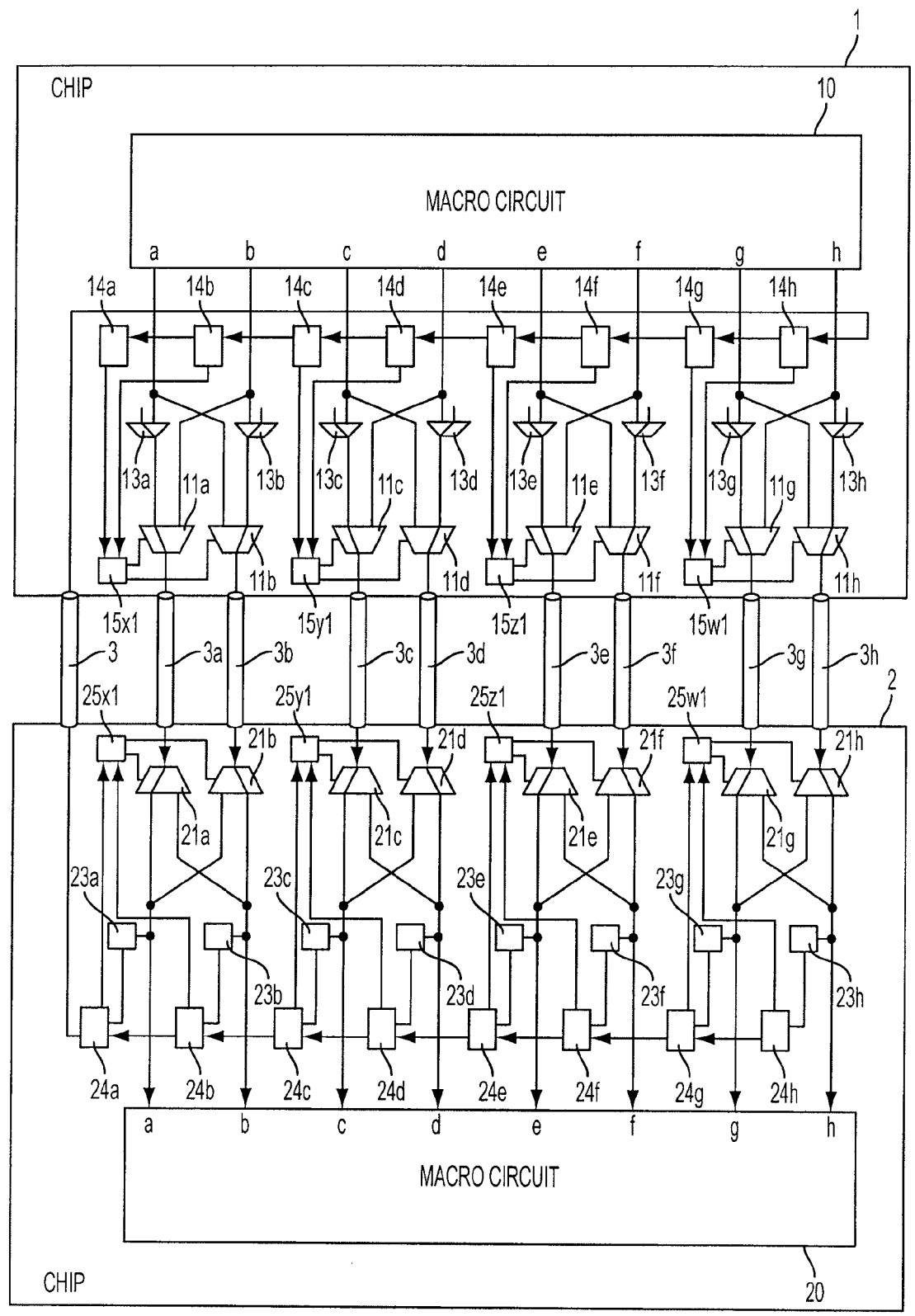
FIG. 1 is a block diagram of a multi-chip semiconductor device according to a first exemplary embodiment of the present invention.

FIG. 1 is a block diagram of a multi-chip semiconductor device according to a first exemplary embodiment of the present invention. The multi-chip semiconductor device of this exemplary embodiment comprises two semiconductor chips 1, 2; 8 chip wires 3a, 3b, 3c, 3d, 3e, 3f, 3g, and 3h; and test result transmission inter-chip wire 3. In this exemplary embodiment, the clock signal used for data transfer between the chips has a frequency of 100 MHz, and therefore the bandwidth between the chips is 800 Mpbs.

Chip 1 includes macro circuit 10; transmission buffer circuits 11a 11b, 11c, 11d, 11e, 11f, 11g, and 11h; selectors 13a, 13b, 13c, 13d, 13e, 13f, 13g, and 13h, registers 14a, 14b, 14c, 14d, 14e, 14f, 14g, and 14h; and transfer speed control units 15x1, 15y1, 15z1, and 15w1. Transfer speed control units 15x1 to 15w1 make up a transfer speed control means. Macro circuit 10 outputs 8-bit data comprised of 1-bit data a, b, c, d, e, f, g, and h. Selectors 13a, 13b, 13c, 13d, 13e, 13f, 13g, and 13h select either data a, b, c, d, e, f, g, h output from macro circuit 10 or test signal t for testing connections (good/faulty) of inter-chip wires 3a, 3b, 3c, 3d, 3e, 3f, 3g, and 3h, respectively, and output the selected data or test signal t to transmission buffer circuits 11a, 11b, 11c, 11d, 11e, 11f, 11g, and 11h, respectively. Selectors 13a to 13h make up a first selector. Registers 14a, 14b, 14c, 14d, 14e, 14f, 14g, and 14h sequentially hold the result of the connection test transmitted from chip 2 through test result transmission inter-chip wire 3. Registers 14a to 14h make up a second test result holding register. Transfer speed control units 15x1, 15y1, 15z1, and 15w1 control data transfer speeds of transmission buffer circuits 11a, 11b, 11c, 11d, 11e, 11f, 11g, and 11h, respectively, based on the test result held in resisters 14a and 14b, 14c and 14d, 14e and 14f, and 14g and 14h, respectively.

Chip 2 includes macro circuit 20; reception buffer circuits 21a, 21b, 21c, 21d, 21e, 21f, 21g, and 21h; connection determination units 23a, 23b, 23c, 23d, 23e, 23f, 23g, and 23h; registers 24a, 24b, 24c, 24d, 24d, 24e, 24f, 24g, and 24h; and transfer speed control units 25x1, 25y1, 25z1, 25w1. Transfer speed control unit 25x1 to 25w1 make up a transfer speed control means. Reception buffer circuits 21a, 21b, 21c, 21d, 21e, 21f, 21g, and 21h receive data transmitted from chip 1 through inter-chip wires 3a, 3b, 3c, 3d, 3e, 3f, 3g, and 3h, respectively, and separate the data into two parts for output. Connection determination units 23a, 23b, 23c, 23d, 23e, 23f, 23g, and 23h compare one output (test pattern) from reception buffer circuits 21a, 21b, 21c, 21d, 21e, 21f, 21g, and 21h which is transmitted from chip 1 with respective expected values held therein, respectively to determine whether connections of inter-chip wires 3a, 3b, 3c, 3d, 3e, 3f, 3g, and 3h are good or faulty, respectively. Registers 24a, 24b, 24c, 23d, 24e, 24f, 24g, and 24h hold the test result of connection of inter-chip wires 3a, 3b, 3c, 3d, 3e, 3f, 3g, and 3h which is output from connection determination units 23a, 23b, 23c, 23d, 23e, 23f, 23g, and 23h, respectively. Registers 24a to 24h make up a first test result holding register. Transfer speed control units 25x1, 25y1, 25z1, and 25w1 control transfer speeds of reception buffer circuits 21a, 21b, 21c, 21d, 21e, 21f, 21g, and 21h, respectively, based on data held in registers 24a and 24b, 24c and 24d, 24e and 24f, and 24g and 24h, respectively. Macro circuit 20 inputs 8-bit data comprised of 1-bit data a, b, c, d, e, f, g, and h which are output from reception buffer circuits 21a, 21b, 21c, 21d, 21e, 21f, 21g, and 21h, respectively.

When a test is conducted to determine whether the connections of inter-chip wires 3a, 3b, 3c, 3d, 3e, 3f, 3g, and 3h are good or faulty, test signal t is selected by selectors 13a, 13b, 13c, 13d, 13e, 13f, 13g, and 13h, respectively, and is transmitted from chip 1 to chip 2 through transmission buffer circuits 11a, 11b, 11c, 11d, 11e, 11f, 11g, and 11h, respectively. A certain defined test pattern is transmitted to chip 2 as test signal t, where connection determination units 23a, 23b, 23c, 23d, 23e, 23f, 23g, and 23h determine whether or not a test signal having the test pattern has been received. When a test signal having the test pattern has been received, the test result logical "0" (good connection) is held in registers 24a, 24b, 24c, 24d, 24e, 24f, 24g, and 24h, respectively. When a test pattern having the test pattern has not been received, the test result of logical "1" (faulty connection) is held in registers 24a, 24b, 24c, 24d, 24e, 24f, 24g, and 24h, respectively. The information as to the test result held in registers 24a, 24b, 24c, 24d, 24e, 24f, 24g, and 24h are transmitted to registers 14a, 14b, 14c, 14d, 14e, 14f, 14g, and 14h in chip 1 in a register chain scan manner through test result transmission inter-chip wire 3. In this case, the test result held in respective registers 24a, 24b, 24c, 24d, 24e, 24f, 24g, and 24h in chip 2 is sequentially transferred to respective registers 14a, 14b, 14c, 14d, 14e, 14f, 14g, and 14h in chip 1 in a stringing manner. In this way, the test result (good/faulty) of the connection of respective inter-chip wires 3a, 3b, 3c, 3d, 3e, 3f, 3g, and 3h held in respective registers 24a, 24b, 24c, 24d, 24e, 24f, 24g, and 24h in chip 2 is transferred to respective registers 14a, 14b, 14c, 14d, 14e, 14f, 14g, and 14h in chip 1.

Figure 2:
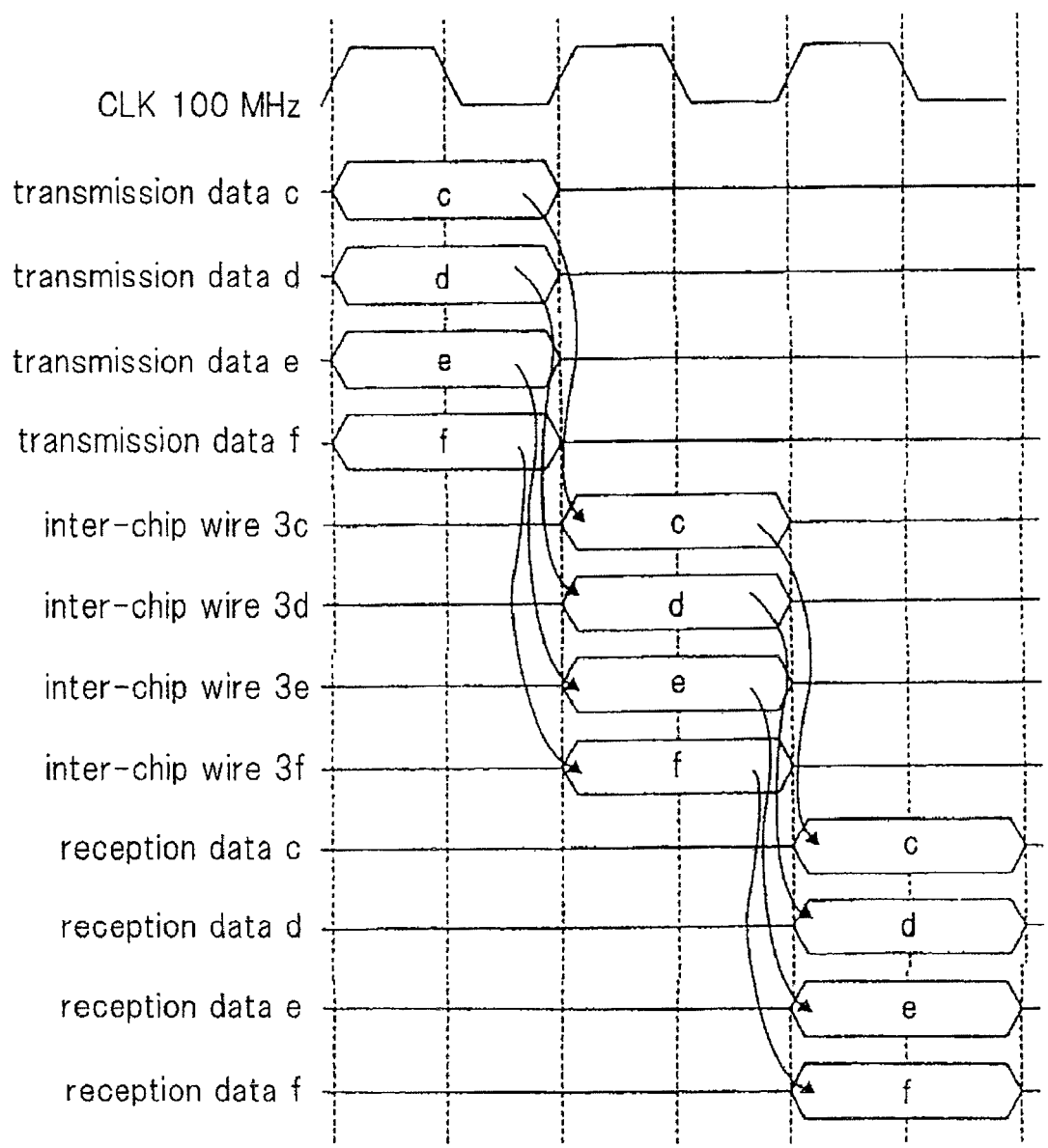
FIG. 2 is a diagram showing transfer timings of data c, d, e, f in the multi-chip semiconductor device of the first exemplary embodiment when there is no faulty connection in inter-chip wires 3a-3f.
Figure 3:
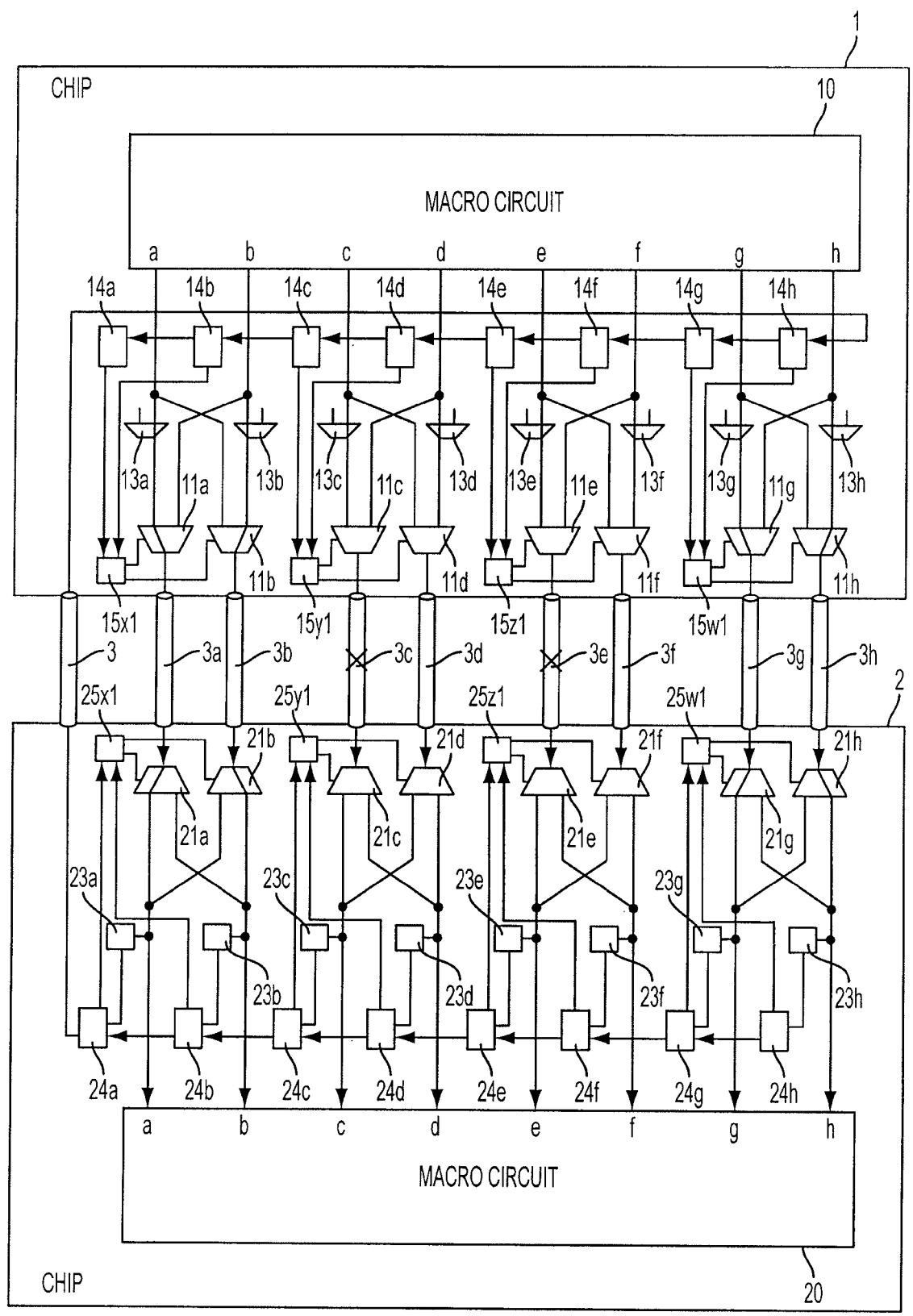
FIG. 3 is a diagram showing that there is a faulty connection in inter-chip wires 3c, 3e in the multi-chip semiconductor device of the first exemplary embodiment.
Figure 4:
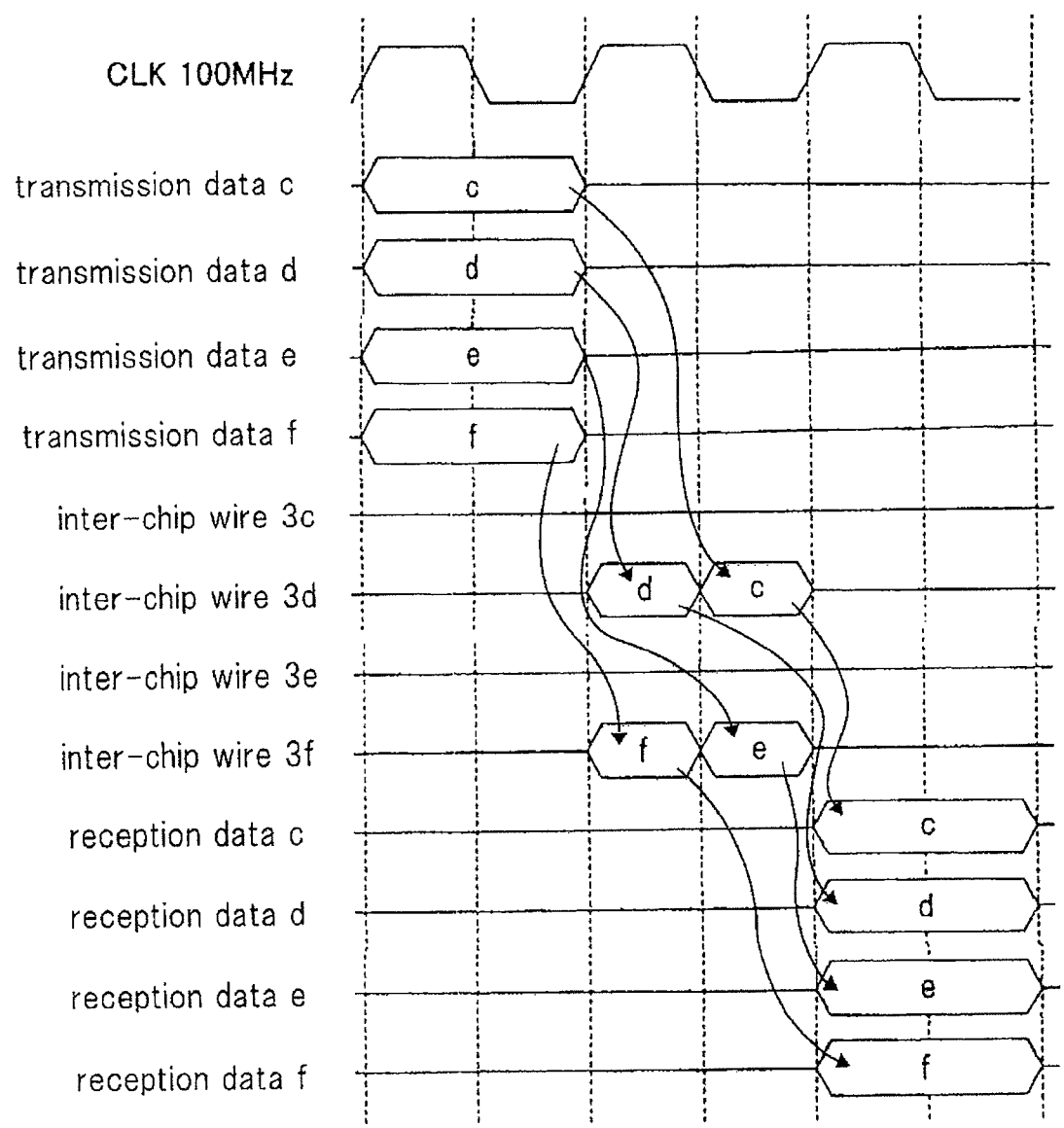
FIG. 4 is a diagram showing transfer timing of data c, d, e, f when there is a faulty connection in inter-chip wires 3c, 3e in the multi-chip semiconductor device of the first exemplary embodiment.

FIG. 2 illustrates the manner in which data c, d, e, and f are transferred from chip 1 to chip 2 when there are no faulty connections in any inter-chip wires, as a result of the connection test, in the multi-chip semiconductor device of FIG. 1. In this case, data c, d, e, and f are each transferred within one period of clock signal CLK of 100 MHz through inter-chip wires 3c, 3d, 3e, and 3f, respectively When the test result reveals faulty connections between two inter-chip wires, i.e., inter-chin wire 3c for data c and inter-chip wire 3e for data e, as shown in FIG. 3, the bandwidth between the chips will be reduced to 600 Mbps. Therefore, in this exemplary embodiment, in order to ensure the bandwidth of 800 Mbps, data is transferred to chip 2 at the double speed through two inter-chip wires 3d, 3f adjacent to inter-chip wires 3c, 3e having faulty connections, respectively, as shown in FIG. 4.

Reception buffer circuits 21d, 21f on chip 2 on the data reception side receive the double-speed data transmitted over inter-chip wires 3d, 3f, respectively, and perform a control to return the data to the original speed data. Transfer speed control units 25y1, 25z1, which have received signals indicative of faulty connection information from registers 24c, 24e, generate a control signal to determine, among the adjacent reception buffer circuits, which reception buffer circuits should receive data at the double speed. With this control signal, reception buffer circuits 21d, 21f connected to normal inter-chip wires 3d, 3f adjacent to inter-chip wires 3c, 3e having faulty connections are controlled such that they convert the double-speed received signals to parallel original-speed signals. Reception buffer circuits 21c, 21e connected to inter-chip wires 3c, 3e having faulty connections are controlled such that they will not transfer signals to macro circuit 20.

In contrast, in chip 1 on the data transmission side, the speeds of data transfer through normal inter-chip wires 3d, 3f adjacent to inter-chip wires 3c, 3e having faulty connections are doubled. For this purpose, the test result of the connection test for respective inter-chip wires 3a, 3b, 3c, 3d, 3e, 3f, 3g, and 3h stored in registers 24a, 24b, 24c, 24d, 24e, 24f, 24g, and 24h is transferred to registers 14a, 14b, 14c, 14d, 14e, 14f, 14g, 14h in chip 1, respectively. Transfer speed control units 15y1, 15z1 which have received signals from registers 14c, 14e which have held the test results of the connection tests transferred thereto generate signals to determine which transmission buffer circuits should transmit data at the double speed. In the case of FIG. 3, in order that data c, e which should otherwise be transmitted through inter-chip wires 3c, 3e having faulty connections, respectively, are transferred through adjacent inter-chip wires 3d, 3f having normal connections, respectively, reception buffer circuits 13d, 13f are controlled by the control signals from transfer speed control units 15y1, 15z1, respectively such that they convert transmission signals at the original speed to transmission signals at the double speed. Transmission buffer circuits 13c, 13e connected to inter-chip wires 3c, 3e having faulty connections are controlled such that they do not output data to inter-chip wires 3c, 3e, respectively. In this way, 800 Mbps of the bandwidth between the chips can be secured.

Figure 5:
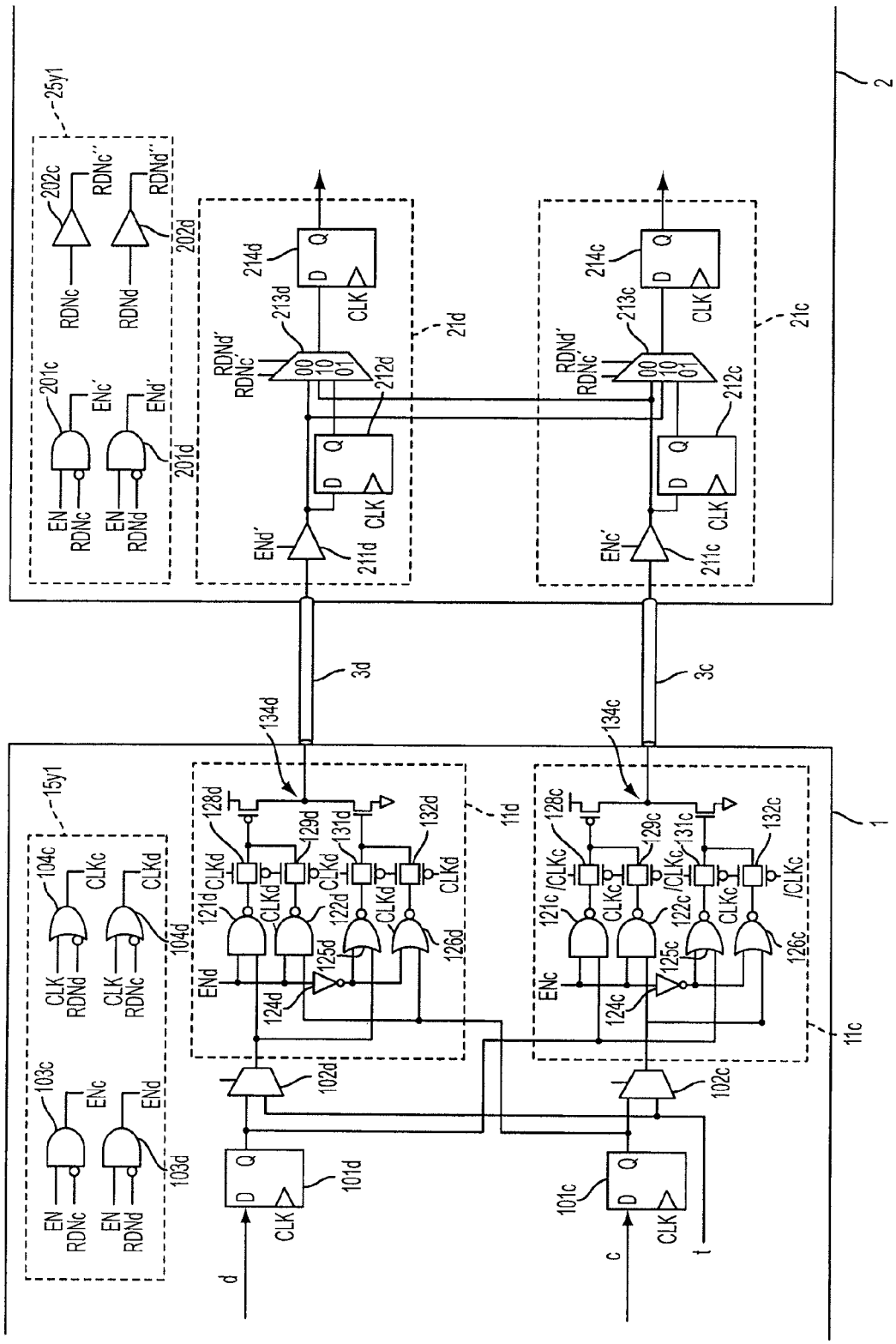
FIG. 5 is a detailed circuit diagram of the multi-chip semiconductor device of the first exemplary embodiment.

FIG. 5 is circuit diagrams of selectors 13c, 13d, transmission buffer circuits 11c, 11d, transfer speed control unit 15y1, reception buffer circuits 21c, 21d, and transfer speed control unit 25y1 in FIGS. 1 and 3. The remaining selectors, transmission buffer circuits, transfer speed control units, reception buffer circuits also have configurations which are identical to them.

D flip-flop 101c and selector 102c make up selector 13c. D flip-flop 101d and selector 102d make up selector 13d. Transfer speed control unit 15y1 is made up of AND gates 103c, 103d and OR gates 104c, 104d. Signal EN to be applied to AND gates 103c, 103d is an enable signal which goes to a high level when data is transferred between chips 1 and 2. Signal RDNc to be applied to AND gate 103c and OR gate 104d is a signal indicative of the test result of connection of inter-chip wire 3c, which is held in register 14c. Signal RDNd to be applied to AND gate 103d and OR gate 104c is a signal indicative of the test result of connection of inter-chip wire 3d, held in register 14d. Signal CLK to be applied to OR gates 104c and 104d is a clock signal to be used in the transfer of data from chip 1 to chip 2. Transmission buffer circuit 11c is made up of NAND gates 121c, 122c, inverter 124c, NOR gates 125c, 126c, transfer gates 128c, 129c, 131c, 132c, and CMOS inverter 134c. In transmission buffer circuit 11c, when enable signal EN is at a high level and signals RDNc, RDNd are both at a low level, i.e., when both inter-chip wires 3c and 3d have good connections, outputs ENc, CLKc of transfer speed control unit 15y1 both go to a high level, and a signal selected by selector 102c (data c or test signal t) is output from CMOS inverter 134c to inter-chip wire 3c through NAND gate 122c, transfer gate 129c, NOR gate 126c, and transfer gate 132c. When enable signal EN is at a high level, signal RDNc is at a low level, and signal RDNd is at a high level, i.e., when inter-chip wire 3c has a good connection but inter-chip wire 3d has a faulty connection, then output ENc of transfer speed control unit 15y1 goes to a high level, and signal CLKc becomes the same as system clock CLK, so that transmission buffer circuit 11c outputs a signal selected by selector 102c (data c or test signal t) within the time interval in which output CLKc is at a high level, and outputs a signal selected by selector 102d (data d or test signal t) within the time interval in which output CLKc is at a low level. When enable signal EN is at a high level and signal RDNc is at a high level, i.e., when inter-chip wire 3c has a faulty connection, output ENc of transfer control unit 15y1 goes to a low level, so that transmission buffer circuit 11c provides a high impedance output. Similarly, transmission buffer circuit 13d is made up of NAND gates 121d, 122d, inverter 124d, NOR gates 125d, 126d, transfer gates 128d, 129d, 131d, 132d, and CMOS inverter 134d. When enable signal EN is at a high level and signals RDNc, RDNd are both at a low level, i.e., when both inter-chip wires 3c and 3d have good connections, outputs ENd, CLKd of transfer speed control unit 15y1 both go to a high level, so that transmission buffer circuit 13d outputs a signal selected by selector 102d (data d or test signal t). When enable signal EN is at a high level, signal RDNd is at a low level, and signal RDNc is at a high level, i.e., when inter-chip wire 3d has a good connection but inter-chip wire 3c has a faulty connection, output ENd of transfer speed control unit 15y1 goes to a high level and signal CLKd becomes the same as clock CLK, so that transmission buffer circuit 11d outputs a signal selected by selector 102d (data d or test signal t) within the time interval in which output CLKd is at a high level, and outputs a signal selected by selector 102c (data c or test signal t) within the time interval in which output CLKd is at a low level. When enable signal EN is at a high level and signal RDNd is at a high level, i.e., when inter-chip wire 3d has a faulty connection, output ENd of transfer control unit 15y1 goes to a low level, so that transmission buffer circuit 11d provides a high impedance output.

Transfer control unit 25y1 is made up of AND gates 201c, 201d and buffers 202c, 202d AND gate 201c receives enable signal EN and signal RDNc, and outputs signal ENc'. AND gate 201d receives enable signal EN and signal RDNd, and outputs signal ENd'. Signal RDNc is a signal indicative of the test result of connection of inter-chip wire 3c, held in register 24c. Signal RDNd to be applied to AND gate 201d and buffer 202d is a signal indicative of the test result of connection of inter-chip wire 3d, held in register 24d. Buffer 202c receives signal RDNc, and outputs signal RDNc'. Buffer 202d receives signal RDNd, and outputs signal RDNd'. Reception buffer circuit 21c is made up of three-state buffer 211c, D flip-flop 212c, selector 213c, and D flip-flop 214c. Three-state buffer 211c is enabled and outputs data from chip 1 transmitted thereto through inter-chip wire 3c when output ENc' of transfer control unit 25y1 is at a high level, i.e., when enable signal EN is at high level and signal RDNc is at a low level (inter-chip wire 3c has a good connection). D flip-flop 212c latches data output from three-state buffer 211c. Selector 213c outputs data transferred from chip 1 through inter-chip wire 3c when the combination of signal RDNc' of transfer control unit 25y1 and output RDNd' is logical "00," i.e., when inter-chip wires 3c and 3d both have good connections; outputs data transferred from reception buffer circuit 21d through inter-chip wire 3d from chip 1 when the combination is logical "10," i.e., when inter-chip wire 3c has a faulty connection but inter-chip wire 3d has a good connection; and outputs data latched in D flip-flop 212c, and transferred one clock before from chip 1 through inter-chip wire 3c when the combination is logical "01," i.e., when inter-chip wire 3c has a good connection but inter-chip wire 3d has a faulty connection. D flip-flop 214c holds the output of selector 213c. Reception buffer circuit 21d is also made up of three-state buffer 211d, D flip-flop 212d, selector 213d, and D flip-flop 214d. Three-state buffer 211d is enabled and outputs data from chip 1 transferred through inter-chip wire 3d when output ENd' of transfer control unit 25y1 is at a high level, i.e., when enable signal EN and signal RDNd are at a low level (inter-chip wire 3d has a good connection). D flip-flop 212d latches data output from buffer 211d. Selector 213d outputs data transferred from chip 1 through inter-chip wire 3d when the combination of outputs RDNd' of transfer control unit 25y1 and signal RDNc' is logical "00," i.e., when inter-chip wires 3d and 3c both have good connections; outputs data transferred from reception buffer circuit 21c through inter-chip wire 3c from chip 1 when the combination is logical "10," i.e., when inter-chip wire 3d has a faulty connection but inter-chip wire 3c has a good connection; and outputs data latched in D flip-flop 212d and transferred one clock before from chip 1 through inter-chip wire 3d when the combination is logical "01," i.e., when inter-chip wire 3d has a good connection but inter-chip wire 3c has a faulty connection. D flip-flop 214d holds the output of selector 213d.

As shown in FIG. 3, when inter-chip wires 3c, 3e have faulty connections, data "1" is held in registers 24c, 24e in chip 2 as the test result, and is transferred to registers 14c, 14e in chip 1, respectively, through test result transmission inter-chip wire 3, and held therein. Control signal CLKd is generated in transfer speed control unit 15y1 in chip 1 and is transmitted to transmission buffer circuit 11d, such that data d is transferred during the time interval in which clock CLK is at a high level, and data c, which is adjacent to data d, is transferred during the time interval in which clock CLK is at a low level, through inter-chip wire 3d having a good connection. On the other hand, control signal ENc at a low level is sent from transfer speed control unit 15y1 to transmission buffer circuit 11c because signal RDNc is at a high level. Thereby, transmission buffer circuit 11c has a high impedance output, so that no data is transferred. Similar operations are performed even when inter-chip wire 3e has a faulty connection.

On the other hand, since data d is transferred from inter-chip wire 3d which has a good connection, reception buffer circuit 21d in chip 2 latches this data in D flip-flop 212d through three-state buffer 211d during the time interval in which clock CLK is at a high level, and holds data d even during a subsequent time interval in which clock CLK is at a low level. Selector 213d is controlled by control signals RDNd' (low level) and RDNc' (high level) sent thereto from transfer speed control unit 25y1 to select a signal of data d sent thereto from D flip-flop 212d and to output the same to D flip-flop 214d. Flip-flop circuit 214d latches data d at the rising edge of clock CLK, and transfers data d to a data line for data d in a data bus connected to macro circuit 20. On the other hand, within the time interval in which clock CLK is at a low level, data c to be transferred through inter-chip wire 3c having a faulty connection is transferred to reception buffer circuit 21d. Since control signal RDNc' is at a high level, and RDNd' is at a low level, a signal of data c sent via reception buffer circuit 21d is selected and output by selector 213c in reception buffer circuit 21c. D flip-flop 214c at the rear of selector 213c latches data c at the rising edge of clock CLK, and transfers data c to a data line for data c in the data bus connected to macro circuit 20. Although an anomalous signal from inter-chip wire 3c having a faulty connection is applied to reception buffer circuit 21c, the anomalous signal will not enter into the reception buffer circuit 21c because control signal ENc' from transfer speed control unit 25y is at a low level and hence the output of three-state buffer 211c of reception buffer circuit 21c has a high impedance.

In this exemplary embodiment, when there is an inter-chip wire having a faulty connection, data which would otherwise be transferred through the inter-chip wire having a faulty connection is transferred through another inter-chip wire having a good connection and with increased data transfer speed, thus making it possible to avoid a reduction in bandwidth for data transfer between the chips.

Second Exemplary Embodiment

Figure 6:
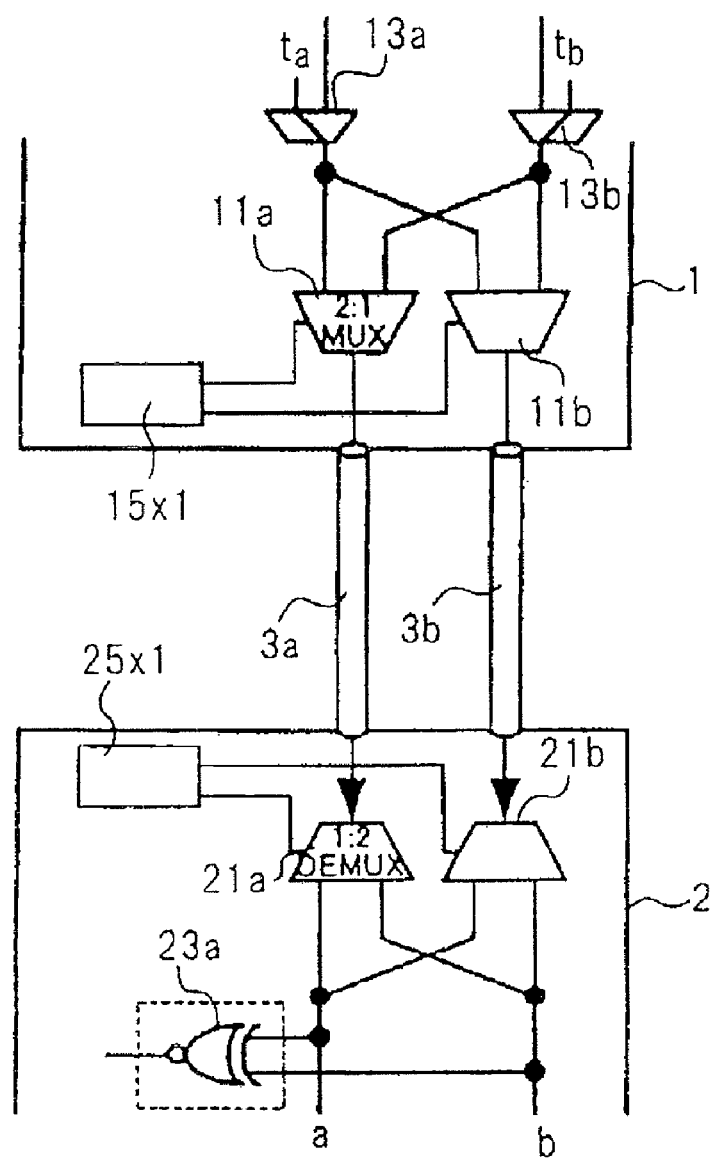
FIG. 6 is a block diagram of a multi-chip semiconductor device according to a second exemplary embodiment of the present invention.

FIG. 6 is a block diagram of a multi-chip semiconductor device according to a second exemplary embodiment of the present invention.

In the first exemplary embodiment, in order to determine whether the connection of each inter-chip wire is good or faulty, a test signal having a certain defined test pattern is transmitted from chip 1 to chip 2, and the connection determination unit in chip 2 determines whether or not a test signal having the test pattern has been received.

In this exemplary embodiment, the data transfer speeds of transmission buffer circuits 11a, 11b connected with inter-chip wire 3a, 3b to be tested for connection are doubled, and test signal $t_a$ to be applied to selector 13a is fixed at a low level, while test signal $t_b$ to be applied to selector 13b is fixed at a high level, such that transmission buffer circuits 11a, 11b alternately transfer a test signal having a high level and a test signal having a low level to chip 2 through inter-chip wire 3a, 3b, respectively. Upon receipt of the test signals, reception buffer circuits 21a, 21b in chip 2 convert the test signals to parallel low and high level signals, through a 1:2 demultiplexing operation. These converted signals are applied to XNOR circuit 23a which serves as a connection determination unit. If the two signals differ one another, the output of XNOR circuit 23a goes to a low level, revealing that data transfer through inter-chip wires 3a, 3b are normal. In contrast, if the output of XNOR circuit 23a is at a high level, it is revealed that data transfer through inter-chip wires 13a, 13b fail due to faulty connections thereof. According to this exemplary embodiment, since only one XNOR circuit is required for the two reception buffer circuits as the connection determination unit, a circuit area of a multi-chip semiconductor device can be reduced.

Third Exemplary Embodiment

In the first exemplary embodiment, the data transfer speeds of a transmission buffer circuit connected with an inter-chip wire adjacent to an inter-chip wire having a faulty connection is doubled. However, a transmission buffer circuit whose data transfer speed is doubled is not limited to a transmission buffer circuit connected with an inter-chip wire adjacent to an inter-chip wire having a faulty connection.

In this exemplary embodiment, transmission buffer circuits whose data transfer speed can be doubled are limited to transmission buffer circuit 12a1 connected with first data transfer inter-chip wire 3a and transmission buffer circuit 12e1 connected with fifth data transfer inter-chip wire 3e. If second and seventh inter-chip wires 3b, 3g have faulty connections, data b which would otherwise be sent through second inter-chip wire 3b is transferred through first inter-chip wire 3a, and data g which would otherwise be sent through seventh inter-chip wire 3g is transferred through fifth inter-chip wire 3e, at double speed, thereby ensuring a bandwidth of 800 Mbps between the chips. In this case, in order to reduce a delay in data transfer such that only the transmission buffer circuits which are capable of switching to the double data transfer speed, these transmission buffer circuits may be increased in their driving force, or wiring resistances may be reduced by increasing the cross-sectional area of the inter-chip wire or by reducing the wiring length of the same. Increasing the transmission buffer circuits in their driving force herein refers to, for example, doubling the width of a transistor used in the transmission buffer circuit to double the amount of current.

Figure 7:
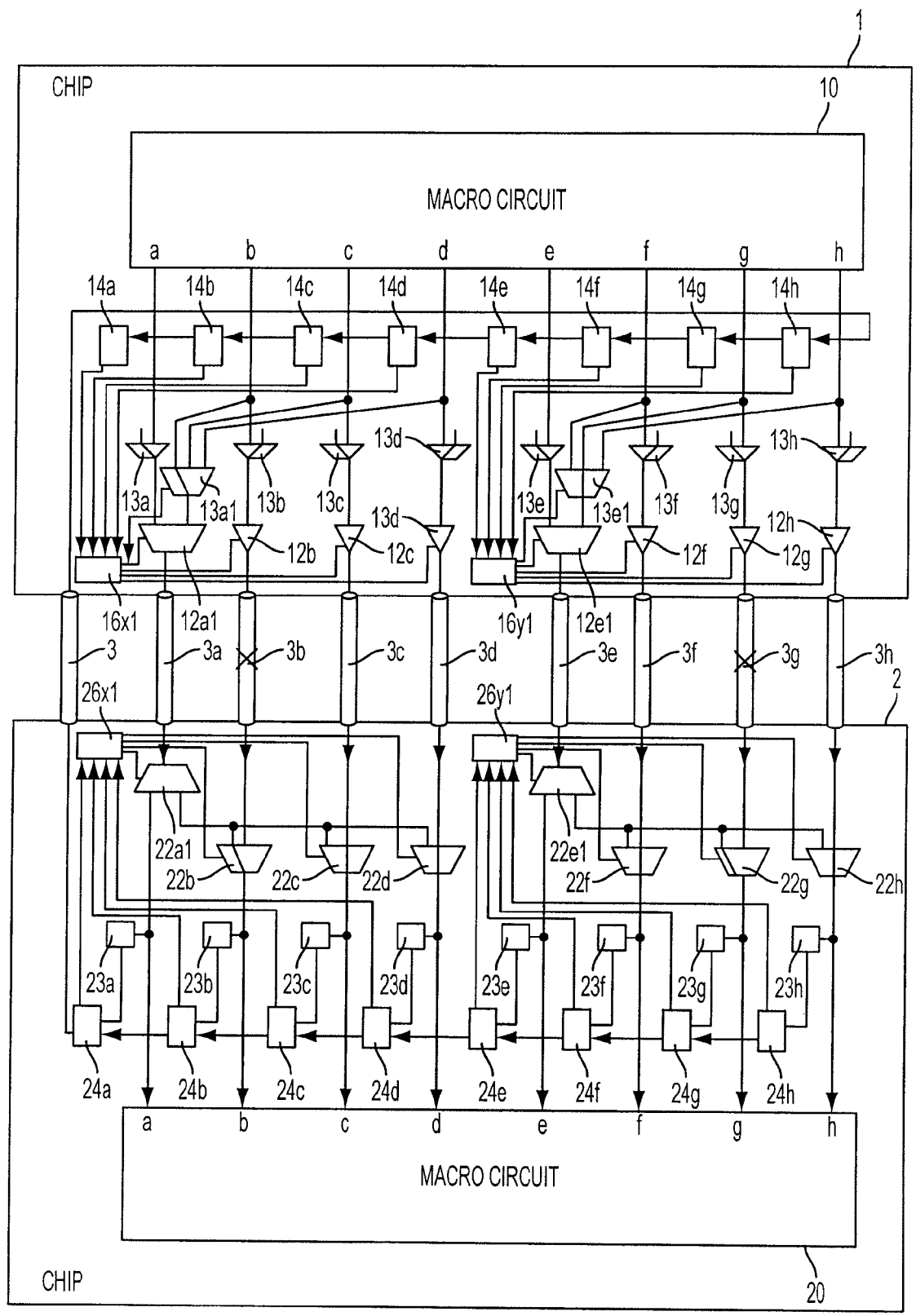
FIG. 7 is a block diagram of a multi-chip semiconductor device according to a third exemplary embodiment of the present invention.

FIG. 7 is a block diagram of a multi-chip semiconductor device according to the third exemplary embodiment of the present invention. Chip 1 includes transmission buffer circuits 12a1, 12b, 12c, 12d, 12e1, 12f, 12g, and 12h; selectors 13a, 13b, 13c, 13d, 13e, 13f, 13g, 13h, 13a1, and 13e1; registers 14a, 14b, 14c, 14d, 14e, 14f, 14g, and 14h; and transfer control units 16x1, 16y1. Chip 2 includes reception buffer circuits 22a1, 22b, 22c, 22d, 22e1, 22f, 22g, and 22h. connection determination units 23a, 23b, 23c, 23d, 23e, 23f, 23g, and 23h; registers 24a, 24b, 24c, 24d, 24e, 24f, 24g, and 24h; and transfer control units 26x1, 26y1. The same numerical designation as was used FIG. 1 is also used in FIG. 7 to designate elements that have same functions.

Figure 8:
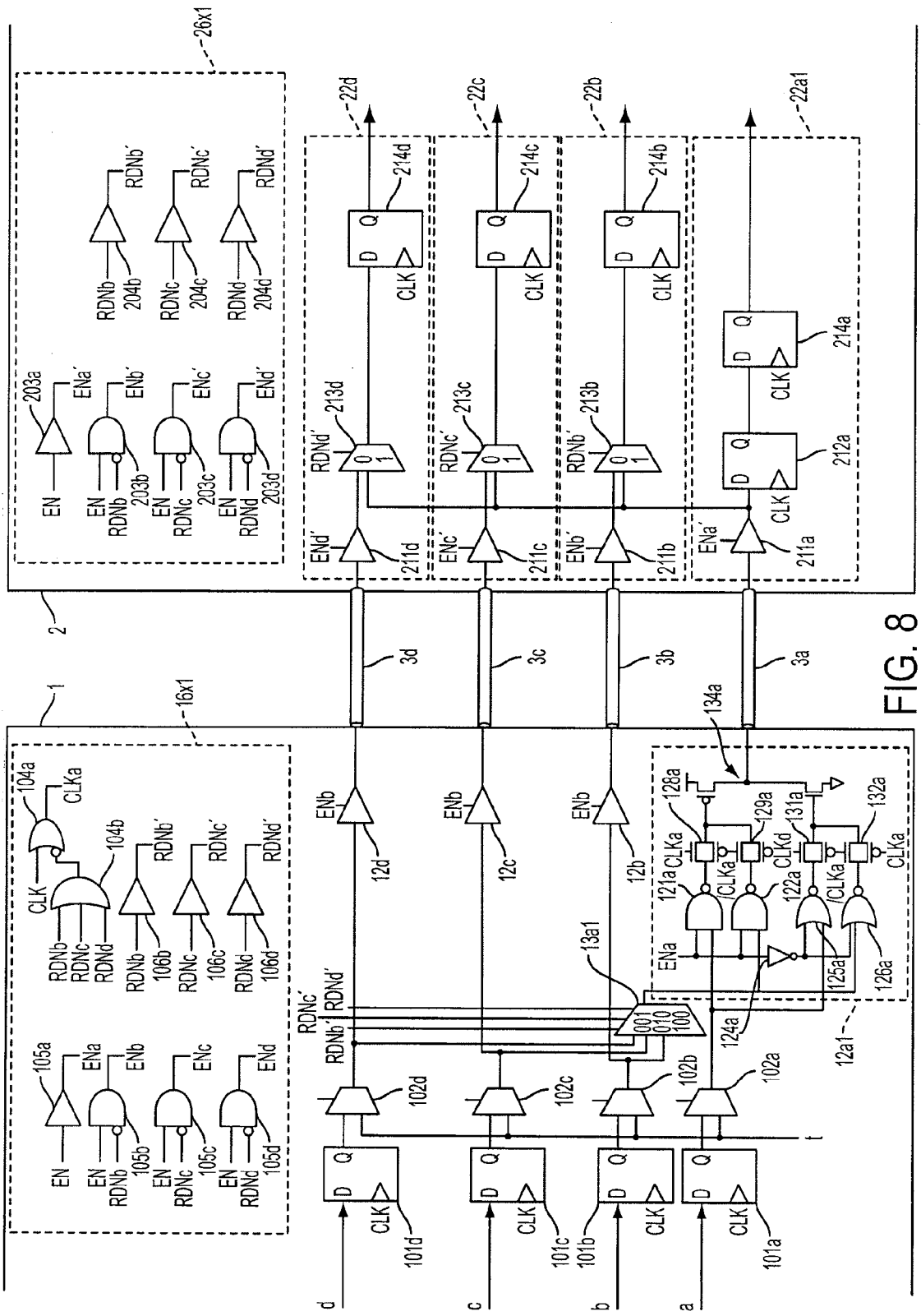
FIG. 8 is a detailed circuit diagram of the multi-chip semiconductor device of the third exemplary embodiment.

FIG. 8 is circuit diagrams of transmission buffer circuits 12a1, 12b, 12c, and 12d; selectors 13a1, 13a, 13b, 13c, and 13d; transfer speed control unit 16x1; reception buffer circuits 22a1, 22b, 22c, and 22d; and transfer speed control unit 26x1. The remaining selectors, transmission buffer circuits, reception buffer circuits, and transfer speed control units also have configurations which are identical to them.

D flip-flop 101a and selector 102a make up selector 13a. D flip-flop 101b and selector 102b make up selector 13b. D flip-flop 101c and selector 102c make up selector 13c. D flip flop 101d and selector 102d make up selector 13d. Transfer speed control unit 16x1 includes buffer 105a; AND gates 105b, 105c, 105d; OR gates 104a, 104b; and buffers 106b, 106c, 106d. RDNb, RDNc, RDNd, which are inputs to transfer speed control unit 16x1, are the test result of connection of inter-chip wires 3b, 3c, and 3d, respectively, which are held in registers 14b, 14c, and 14d, respectively. Transmission buffer circuit 12a1 has the same configuration as those of transmission buffer circuits 11c, 11d in FIG. 1. Transmission buffer circuits 12b, 12c, and 12d are three-state buffers which are enabled by high level enable signals ENb, ENc, and ENd, respectively, which are outputs of transfer speed control unit 16x1. Selector 13a1 selects from the outputs of selector 102d, 102c, and 102b, respectively, when the combination of outputs RDNb', RDc', RDd' of transfer speed control unit 16x1 are logical "001," "010", and "100", respectively.

Transfer speed control unit 26x1 includes buffer 203a; AND gates 203b, 203c, and 203d; and buffers 204b, 204c, and 204d. Reception buffer circuit 22a1 includes three-state buffer 211a and D flip-flops 212a, 214a. Reception buffer circuit 22b includes three-state buffer 211b, selector 213b, and D flip-flop 214b. Reception buffer circuit 22c includes three-state buffer 211c, selector 213c, and D flip-flop 214c. Reception buffer circuit 22d includes three-state buffer 211d, selector 213d, and D flip-flop 214d. Three-state buffers 211a, 211b, 211c, and 211d are enabled by high level enable signals ENa', ENb', ENc', ENd', respectively, which are outputs of transfer speed control unit 26x1. Selector 213b selects the output of three-state buffer 211b when output RDNb' of transfer speed control unit 26x1 is logical "0," and selects the output of three-state buffer 211a when RDNb' is logical "1." Selector 213c selects the output of three-state buffer 211c when output RDNc' of transfer speed control unit 26x1 is logical "0," and selects the output of three-state buffer 211a when RDNc' is logical "1." Selector 213d selects the output of three-state buffer 211d when output RDNd' of transfer speed control unit 26x1 is logical "0," and selects the output of three-state buffer 211a when RDNd' is logical "1."

Fourth Exemplary Embodiment

In the first exemplary embodiment, the data transfer speeds of some transmission buffer circuits have been doubled in order to transfer data which would otherwise be transferred through an inter-chip wire having a faulty connection, but the data transfer speed is not limited to be the double speed. In this exemplary embodiment, for example, when second inter-chip wire 3b through which data b would otherwise be sent, and third inter-chip wire 3c through which data c would otherwise be sent, have faulty connections, the data transfer speed of transmission buffer circuit 12a2 which is connected with first inter-chip wire 3a is increased three times to transfer both data b and c together with data a through inter-chip wire 3a.

Figure 10:
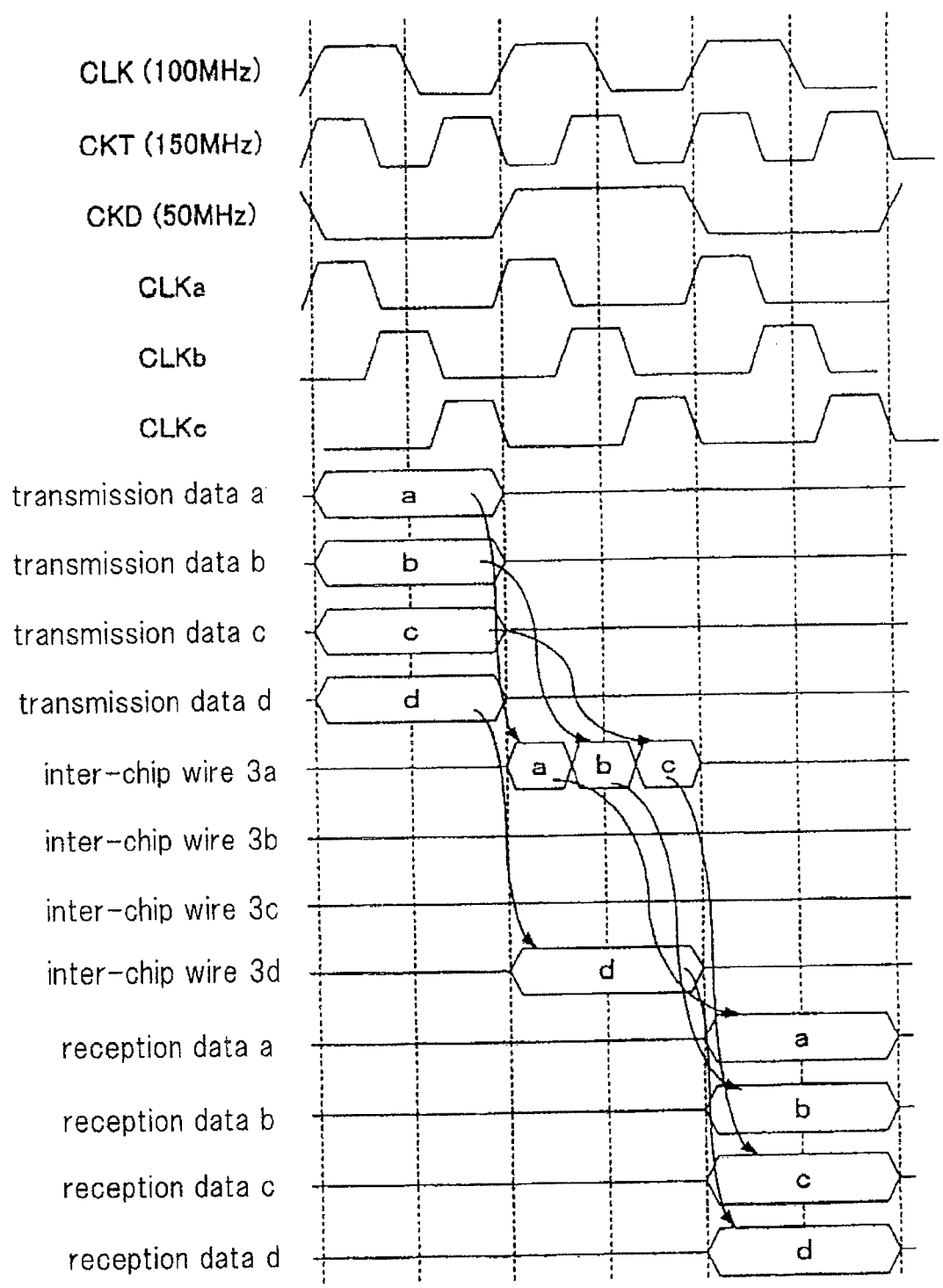
FIG. 10 is a diagram showing transfer timings of data a, b, c, d in the multi-chip semiconductor device of the fourth exemplary embodiment when there is a faulty connection in inter-chip wires 3b, 3c.

FIG. 10 is a timing diagram of data transfer in the present exemplary embodiment. Since the data transfer speed can be increased up to only twice within the time interval in which 100 MHz clock CLK is at a high level and within the time interval in which a 100 MHz clock CLK is at a low level, clock CKT which is obtained by increasing the frequency of clock CLK by a factor of 1.5 is provided. When switching the data transfer speed to three times data transfer speed, the clock for the transmission buffer circuit is switched to 150-MHz clock CKT, which has a frequency 1.5 times the frequency of clock CLK, by a control signal from a transfer speed control unit, and data is transferred within the time interval in which clock CKT is at a high level and within the time interval in which clock CKT is at a low level.

Figure 9:
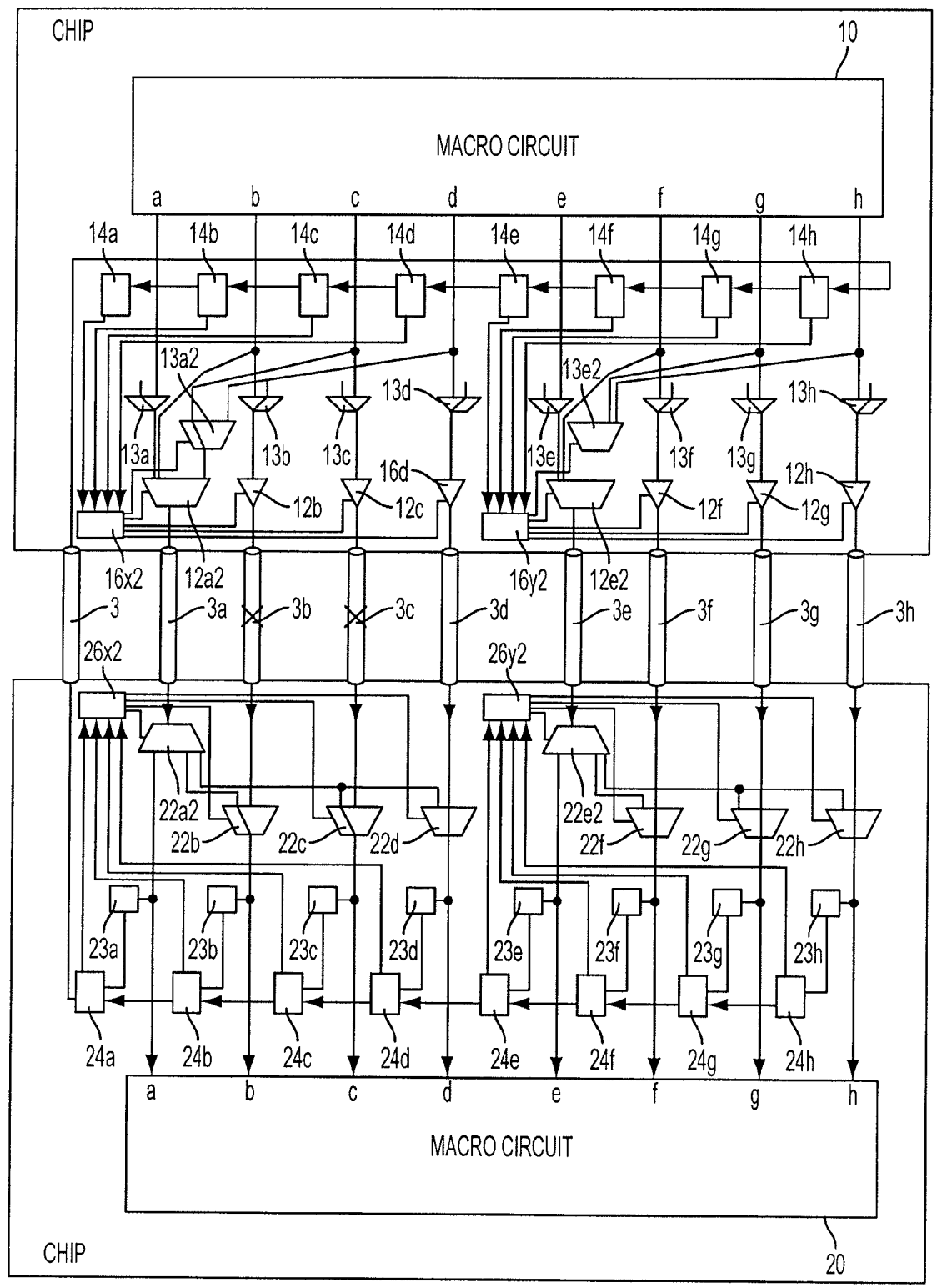
FIG. 9 is a block diagram of multi-chip semiconductor device according to a fourth exemplary embodiment of the present invention.

FIG. 9 is a block diagram of a multi-chip semiconductor device of this exemplary embodiment. Chip 1 includes transmission buffer circuits 12a2, 12b, 12c, 12d, 12e2, 12f, 12g, and 12h; selectors 13a, 13b, 13c, 13d, 13e, 13f, 13g, 13h, 13a2, and 13e2; registers 14a, 14b, 14c, 14d, 14e, 14f, 14g, and 14h; and transfer control units 16x2 and 16y2. Chip 2 includes reception buffer circuits 22a2, 22b, 22c, 22d, 22e2, 22f, 22g, and 22h; connection determination units 23a, 23b, 23c, 23d, 23e, 23f, 23g, and 23h; registers 24a, 24b, 24c, 24d, 24e, 24f, and 24h; and transfer control unit 26x2, 26y2. The same numerical designation as was used FIG. 1 is also used in FIG. 9 to designate elements that have same functions.

Figure 11:
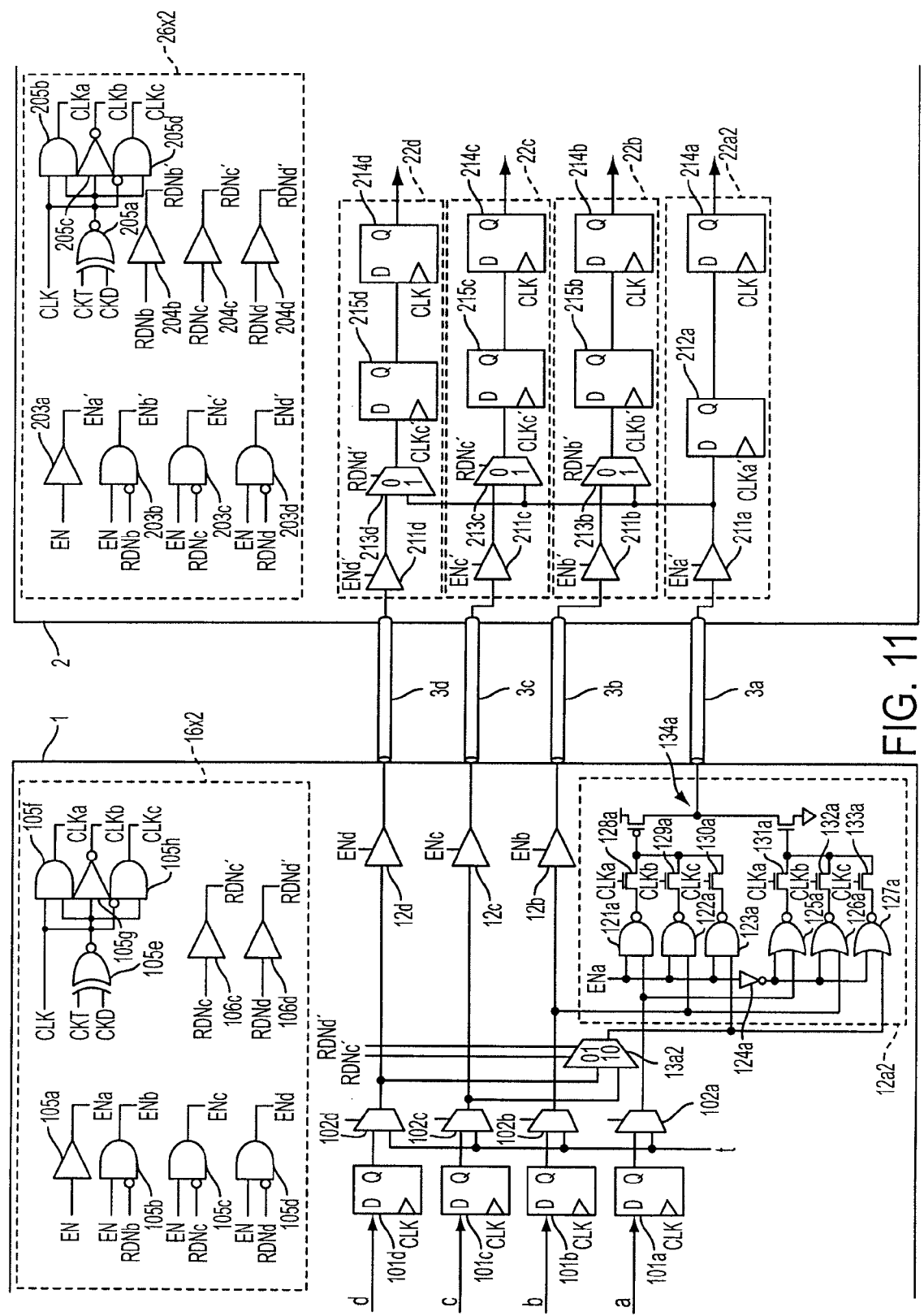
FIG. 11 is a detailed circuit diagram of the multi-chip semiconductor device of the fourth exemplary embodiment.

FIG. 11 is circuit diagrams of selectors 13a, 13b, 13c, 13d, and 13a2; transfer buffer circuits 12a2, 12b, 12c, and 12d; transfer speed control unit 16x2; reception buffer circuits 22a2, 22b, 22c, and 22d; and transfer speed control unit 26x2 within FIG. 9. The remaining selectors, transmission buffer circuits reception buffer circuits, and transfer speed control units also have configurations which are identical to them.

D flip-flop 101a and selector 102a make up selector 13a. D flip-flop 101b and selector 102b make up selector 13b. D flip-flop 101c and selector 102c make up selector 13c. D flip flop 101d and selector 102d make up selector 13d. Transfer speed control unit 16x2 includes buffer 105a; AND gates 105b, 105c, and 105d; buffers 106c, 106d; exclusive NOR gate 105e, AND gates 105f, 105h; and inverter 105g. RDNb, RDNc, RONd, which are applied to transfer speed control unit 16x2, are the test results of connection of inter-chip wires 3b, 3c, and 3d, which are held in registers 14b, 14c, and 14d, respectively. Transmission buffer circuit 12a2 includes AND gates 121a, 122a, and 123a; inverter 124a; NOR gates 125a, 126a, and 127a; transfer gates 128a, 129a, 130a, 131a, 132a, and 133a; and CMOS inverter 134a. Transmission buffers 12b, 12c, and 12d are three-state buffers which are enabled by high level enable signals ENb, ENc, ENd, respectively, which are outputs of transfer speed control unit 16x2. Selector 13a2 selects the output of selector 102d when the combination of outputs RDNc' and RDNd' of transfer speed control unit 16x2 is logical "01", and selects the output of selector 102c when the combination is logical "10".

Transfer speed control unit 26x2 includes buffer 203a; AND gates 203b, 203c, and 203d; buffers 204b, 204c, and 204d; XNOR gate 205a; AND gates 205b and 205d; and inverter 205c. Reception buffer circuit 22a2 includes three-state buffer 211a, and D flip-flops 212a, 214a. Reception buffer circuit 22b includes three-state buffer 211b, selector 213b, and D flip-flops 215b, 214b. Reception buffer circuit 22c includes three-state buffer 211c, selector 213c, and D flip-flops 215c, 214c. Reception buffer circuit 22d includes three-state buffer 211d, selector 213d, and D flip-flops 215d, 214d. Three-state buffers 211a, 211b, 211c, 211d are enabled by high level enable signals ENa', ENb', ENc', ENd', respectively, which are outputs of transfer speed control unit 26x2. Selector 213b selects the output of three-state buffer 211a when output RDNb' of transfer speed control unit 26x2 is logical "1", and selects the output of three-state buffer 211b when RDNb' is "0." Selector 213c selects the output of three-state buffer 211a when output RDNc' of transfer speed control unit 26x2 is logical "1", and selects the output of three-state buffer 211c when RDNc' is logical "0." Selector 213d selects the output of three-state buffer 211a when output RDNd' of transfer speed control unit 26x2 is logical "1", and selects the output of three-state buffer 211d when RDNd' is logical "0".

Fifth Exemplary Embodiment

Figure 13:
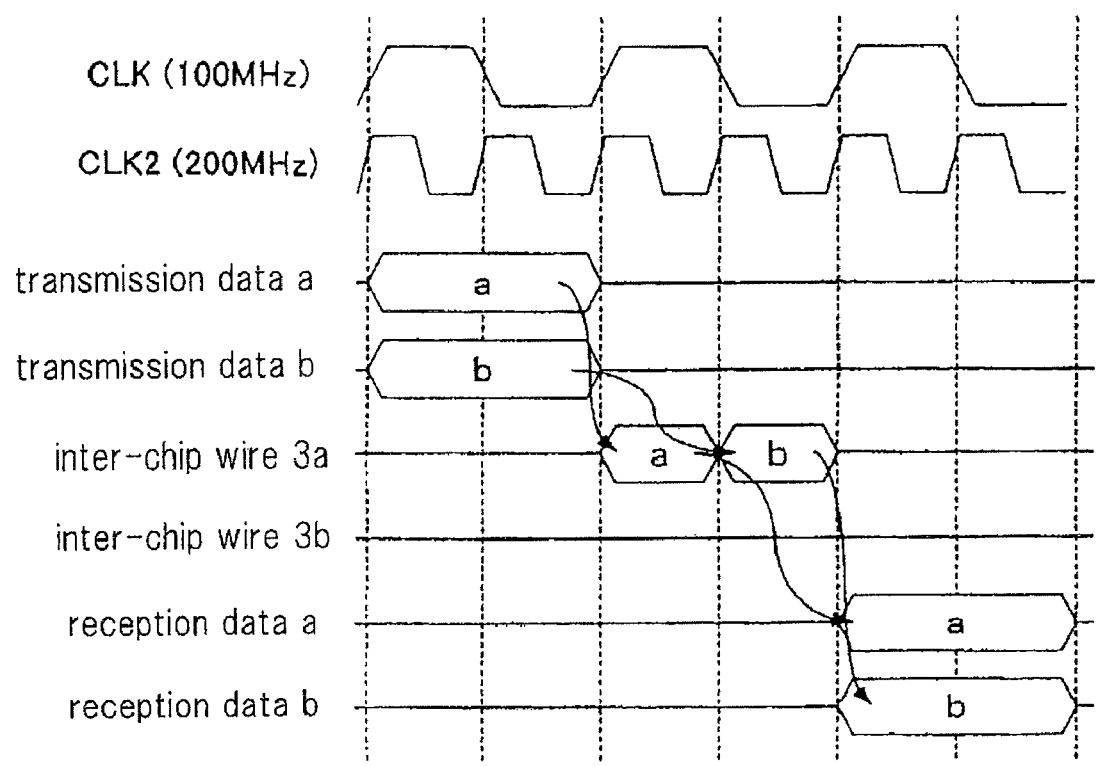
FIG. 13 is a timing diagram for data transfer in the multi-chip semiconductor device of the fifth exemplary embodiment.

In this exemplary embodiment, a plurality (here two) of clocks having different frequencies are provided and the data transfer speed can be switched to a plurality of speeds in response to a control signal from a transfer speed control unit. FIG. 13 is a timing diagram of a data transfer when the data transfer speed is doubled using a conventional 100-MHz clock CLK and a 200-MHz clock CLK2 which has a frequency two times the frequency of clock CLK. 200-MHz clock CLK2 is used in the transmission buffer circuit and reception buffer circuit for transferring data through inter-chip wire 3a at the doubled speed.

Figure 12:
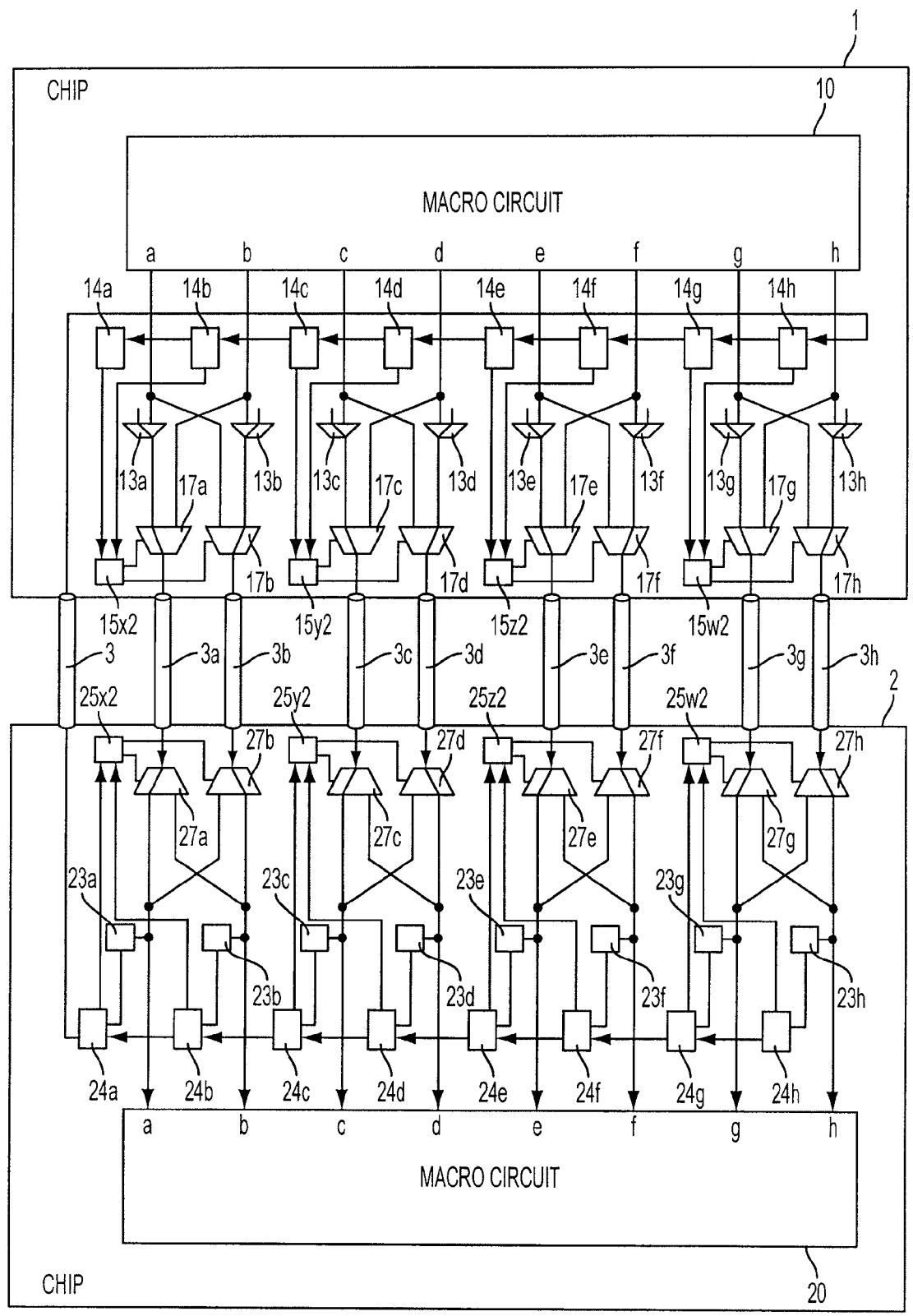
FIG. 12 is a block diagram of a multi-chip semiconductor device according to a fifth exemplary embodiment of the present invention.

FIG. 12 is a block diagram of a multi-chip semiconductor device of this exemplary embodiment. Chip 1 includes macro circuit 10; transmission buffer circuits 17a, 17b, 17c, 17d, 17e, 17f, 17g, and 17h; selectors 13a, 13b, 13c, 13d, 13e, 13f, 13g, and 13h; registers 14a, 14b, 14c, 14d, 14e, 14f, 14g, and 14h; and transfer speed control units 15x2, 15y2, 15z2, and 15w2. Chip 2 includes macro circuit 20; reception buffer circuits 27a, 27b, 27c, 27d, 27e, 27f, 27g, and 27h; selectors 23a, 23b, 23c, 23d, 23e, 23f, 23g, and 23h; registers 24a, 24b, 24c, 24d, 24e, 24f, 24g, and 24h; and transfer speed control units 25x2, 25y2, 25z2, and 25w2.

Figure 14:
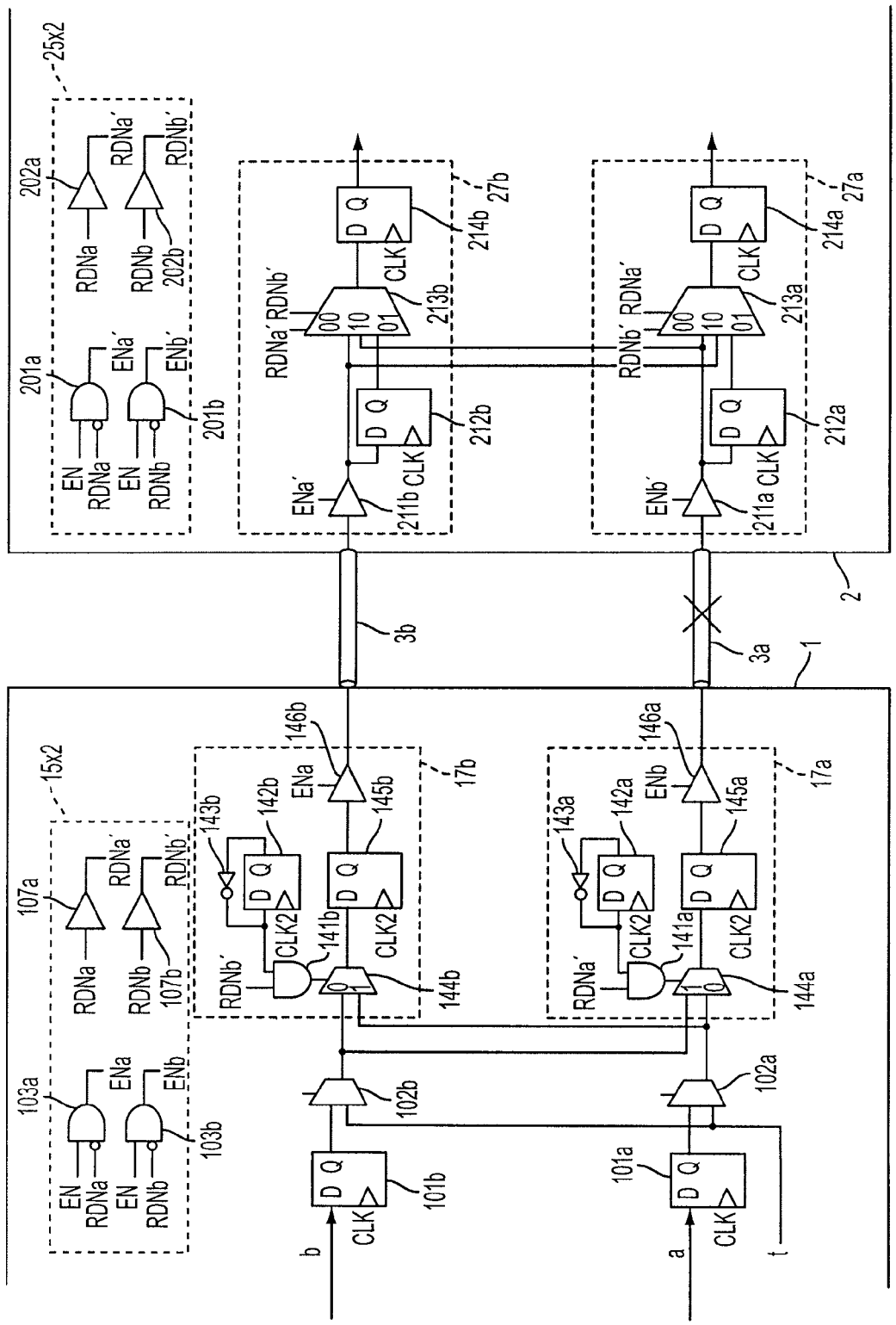
FIG. 14 is a detailed circuit diagram of the multi-chip semiconductor device of the fifth exemplary embodiment.

FIG. 14 is circuit diagrams of selectors 12a, 12b; transmission buffer circuits 17a, 17b; transfer speed control unit 15x2; reception buffer circuits 27a, 27b; and transfer speed control unit 25x2 in FIG. 12. The remaining selectors, transmission buffer circuits, transfer speed control units, and reception buffer circuits have configurations which are identical to them.

D flip-flop 101a and selector 102a make up selector 13a. D flip-flop 101b and selector 102b make up selector 13b. Transfer speed control unit 15x2 includes AND gates 103a, 103b and buffers 107a, 107b. Transmission buffer circuit 17a includes AND gate 141a, D flip-flop 142a, inverter 143a, selector 144a, D flip-flop 145a, and three-state buffer 146a. Selector 144a selects the output of selector 102a when the output of AND gate 141a is logical "0", and selects the output of selector 102b when the output of AND gate 141a is logical "1". Similarly, transmission buffer circuit 17b includes AND gate 141b, D flip-flop 142b, inverter 143b, selector 144b, D flip-flop 145b, and three-state buffer 146b. Selector 144b selects the output of selector 102b when the output of AND gate 141b is logical "0", and selects the output of selector 102a when the output of AND gate 141b is logical "1". Transfer speed control unit 25x2 includes AND gates 201a, 102b; and buffers 202a, 202b. Reception buffer circuit 27a includes three-state buffer 211a, D flip-flops 212a, selector 213a, and D flip-flop 214a. Selector 213a selects the output of three-state buffer 211a, three-state buffer 211b, and D flip-flop 212a when the combination of outputs RDNb', RDNa' of transfer control unit 25x2 is logical "00", "10", and "01," respectively. Similarly, reception buffer circuit 27b includes three-state buffer 211b, D flip-flop 212b, selector 213b, and D flip-flop 214b. Selector 213b selects the output of three-state buffer 211b, three-state buffer 211a, and D flip-flop 212b when the combination of outputs RDNa', RDNb' of transfer control unit 25x2 is logical "00", "10", and "01", respectively.

Sixth Exemplary Embodiment

In this exemplary embodiment, a plurality (here two) of clocks having different phases are provided and the data transfer speed can be switched to a plurality of speeds by transmitting or receiving data at timings of the edges of the respective clocks.

Figure 16:
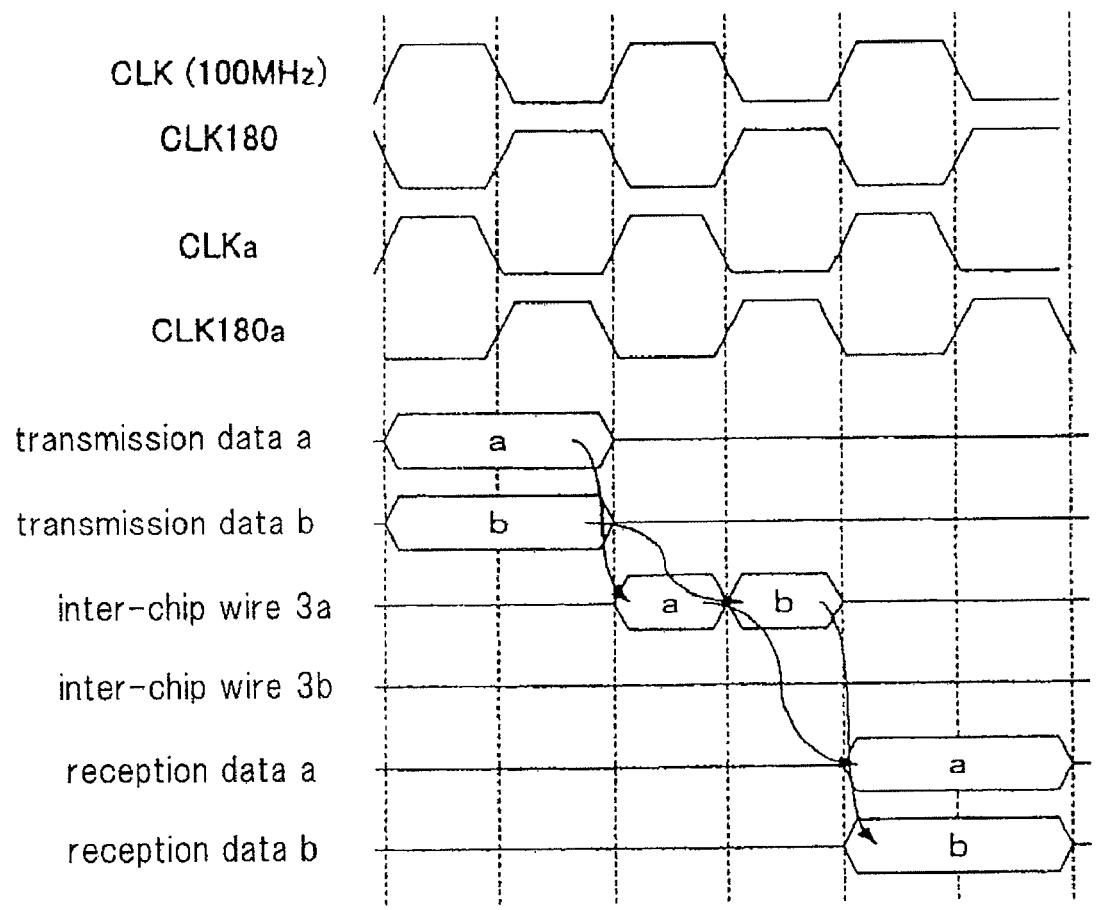
FIG. 16 is a timing diagram for data transfer in the multi-chip semiconductor device of the sixth exemplary embodiment.

FIG. 16 is a timing diagram of a data transfer when the data transfer speed is doubled using a conventional 100-MHz clock CLK, and a 100-MHz clock CLK180 which is 180 degrees out of phase thereto. In order to double the speed of data transfer through inter-chip wire 3a, data a is transmitted or received at the timings of edges of conventional clock CLK, and data b is transmitted or received at the timings of edges of clock CLK180 which is 180 degrees out of phase with clock CLK. However, in order to prevent data a and b from overlapping each other on inter-chip wire 3a, data are transferred through inter-chip wire 3a only within a time interval in which the respective clocks are at a high level.

Figure 15:
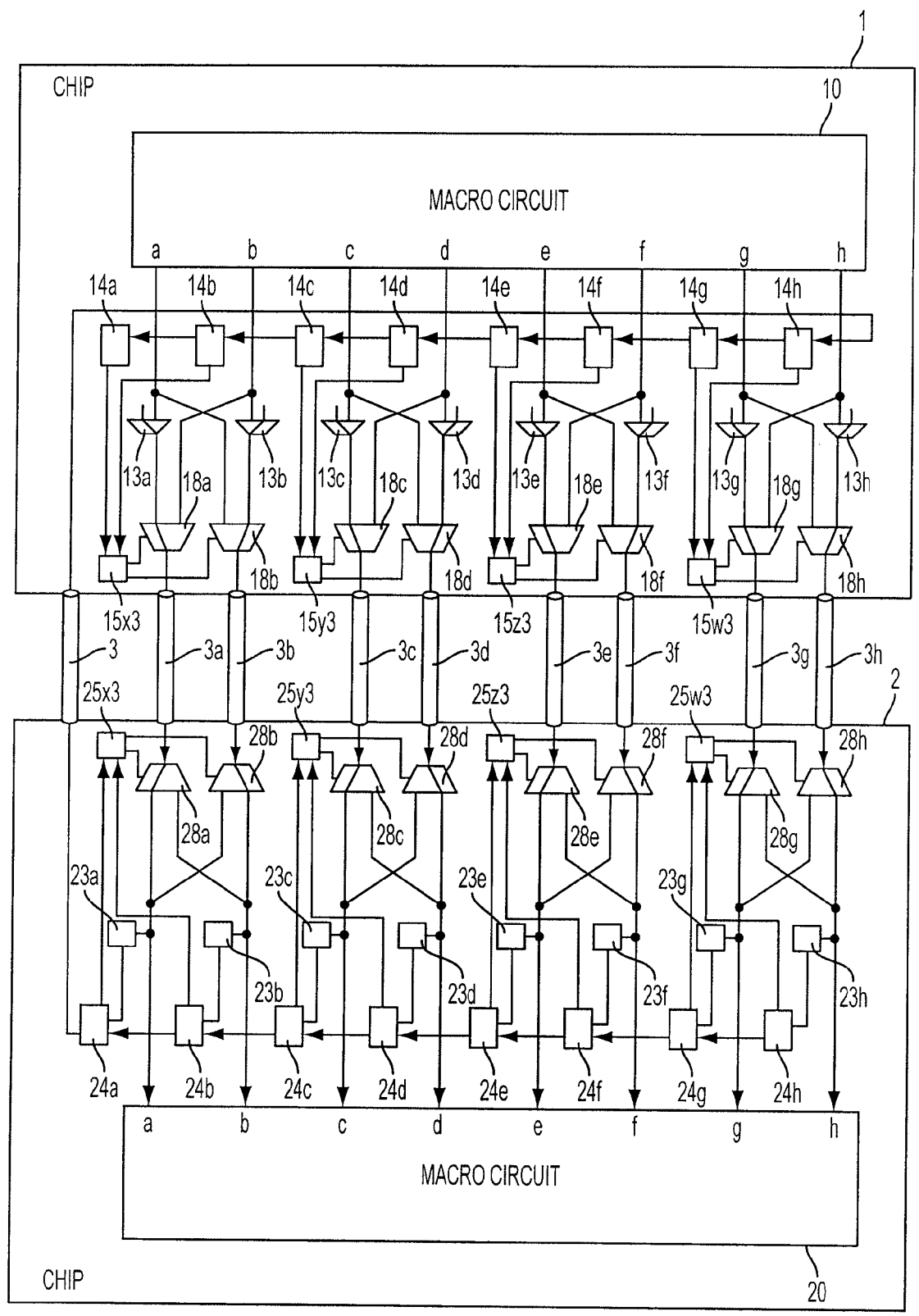
FIG. 15 is a block diagram of a multi-chip semiconductor device according to a sixth exemplary embodiment of the present invention.

FIG. 15 is block diagrams of a multi-chip semiconductor device of this exemplary embodiment. Chip 1 includes macro circuit 10; transmission buffer circuits 18a, 18b, 18c, 18d, 18e, 18f, 18g, and 18h; selectors 13a, 13b, 13c, 13d, 13e, 13f, 13g, and 13h; registers 14a, 14b, 14c, 14d, 14e, 14f, 14g, and 14h; and transfer speed control units 15x3, 15y3, 15z3, and 15w3. Chip 2 includes macro circuit 20; reception buffer circuits 28a, 28b, 28c, 28d, 28e, 28f, 28g, and 28h; selectors 23a, 23b, 23c, 23d, 23e, 23f, 23g, and 23h; registers 24a, 24b, 24c, 24d, 24e, 24f, 24g, and 24h, and transfer speed control units 25x3, 25y3, 25z3, and 25w3.

Figure 17:
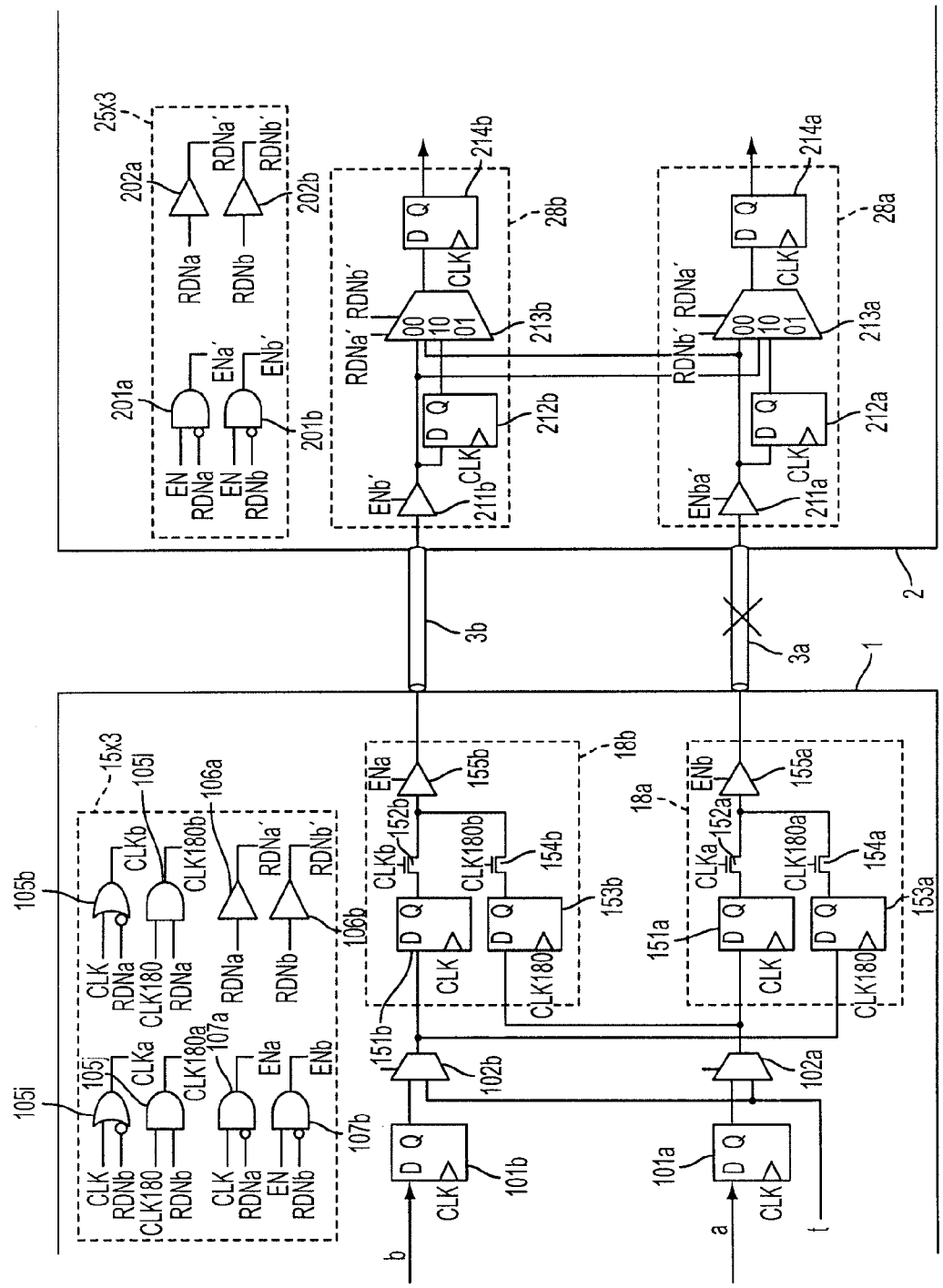
FIG. 17 is a detailed circuit diagram of the multi-chip semiconductor device of the sixth exemplary embodiment.

FIG. 17 is a circuit diagram of selectors 13a, 13b; transfer buffer circuits 18a, 18b; transfer speed control unit 15x3; reception buffer circuits 28a, 28b; and transfer speed control unit 27x3 in FIG. 15. The remaining selectors, transmission buffer circuits, transfer speed control units, and reception buffer circuits have configurations which are identical to them.

D flip-flop 101a and selector 102a make up selector 13a. D flip-flop 101b and selector 102b make up selector 13b. Transfer speed control unit 15x3 includes AND gates 107a, 107b, OR gates 105i, 105b; AND gates 105j, 105l, and buffers 106a, 106b. Transmission buffer circuit 18a includes D flip-flops 151a, 153a; transfer gates 152a, 154a; and three-state buffer 155a. Similarly, transmission buffer circuit 18b includes D flip-flops 151b, 153b; transfer gates 152b, 154b; and three-state buffer 155b. Transfer speed control unit 25x3 includes AND gates 201a, 102b and buffers 202a, 202b. Reception buffer circuit 28a includes three-state buffer 211a, D flip-flops 212a, selector 213a, and D flip-flop 214a. Selector 213a selects the outputs of three-state buffer 211a, three-state buffer 211b, and D flip-flop 212a when the combination of outputs RDNb', RDNa' of transfer control unit 25x3 is logical "00", "10", and "01," respectively. Similarly, transmission buffer circuit 28b includes three-state buffer 211b, D flip-flop 212b, selector 213b, and D flip-flop 214b. Selector 213b selects the outputs of three-state buffer 211b, three-state buffer 211a, and D flip-flop 212b when the combination of outputs RDNa', RDNb' of transfer control unit 25x2 is logical "00", "10", and "01," respectively.

Seventh Exemplary Embodiment

In the foregoing exemplary embodiments, test result transmission inter-chip wire 3 is provided for transmitting the test result to chip 1. However, in this exemplary embodiment, by using the inter-chip wires used for normal data transfer only when the test result is transmitted, inter-chip wire 3 for transmitting the test result is dispensed with.

Figure 18:
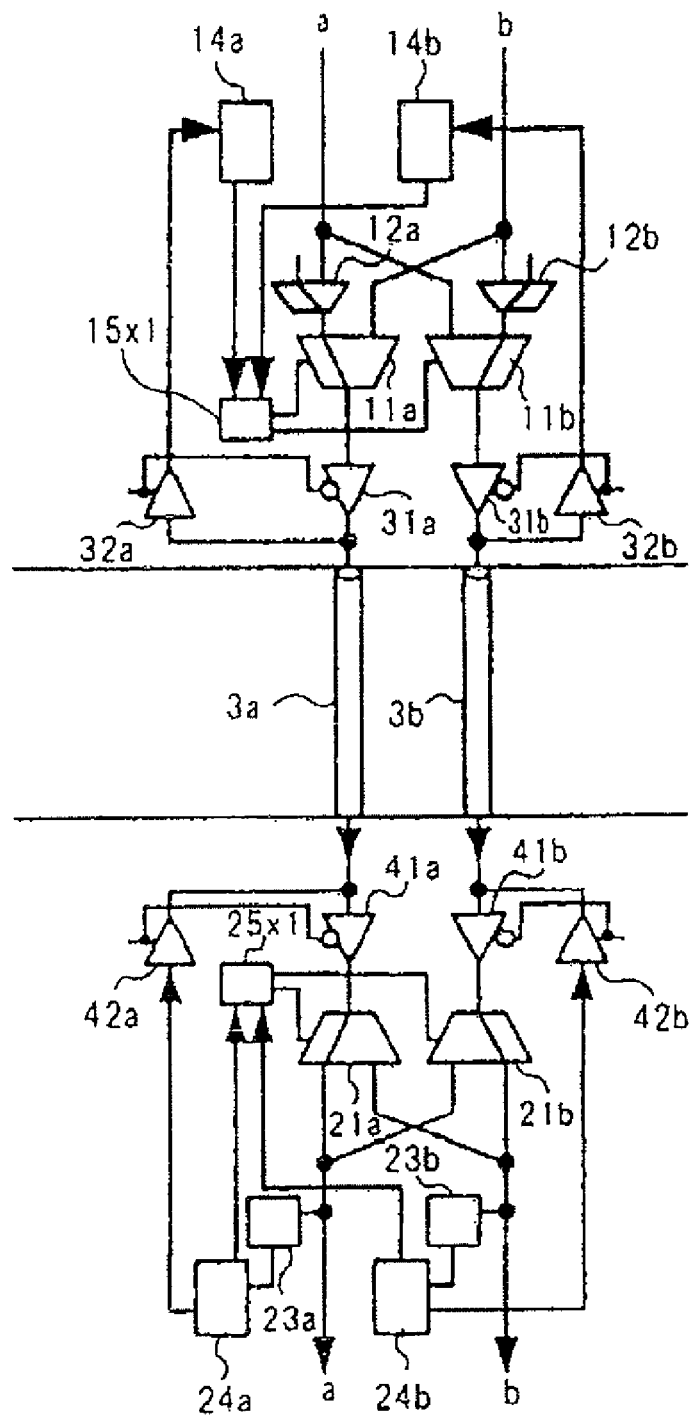
FIG. 18 is a block diagram of an essential part in a multi-chip semiconductor device according to a seventh exemplary embodiment of the present invention.

FIG. 18 is a block diagram of a multi-chip semiconductor device of this exemplary embodiment. While FIG. 18 shows only circuits associated with a data transfer through inter-chip wires 3a and 3b, circuits for data transfer through other inter-chip wires are similar.

Chip 1 newly includes three-state buffers 31a, 32a, 31b, and 32b. Three-state buffer 31a is provided between transmission buffer circuit 11a and inter-chip wire 3a. Three-state buffer 31b is provided between transmission buffer circuit 11b and inter-chip wire 3b. Three-state buffer 32a has its input connected between three-state buffer 31a and inter-chip wire 3a, and its output connected to register 14a. Three-state buffer 32b has its input connected between three-state buffer 31b and inter-chip wire 3b, and its output connected to register 14b. Three-state buffers 31a, 31b are enabled when data is transferred from chip 1 to chip 2, while three-state buffer 32a, 32b are enabled when the test result of connection is transmitted.

Chip 2 newly includes three-state buffers 41a, 42a, 41b, and 42b. Three-state buffer 41a is provided between reception buffer circuit 21a and inter-chip wire 3a. Three-state buffer 41b is provided between reception buffer circuit 21b and inter-chip wire 3b. Three-state buffer 42a has its output connected between three-state buffer 41a and inter-chip wire 35a, and has its input connected to register 24a. Three-state buffer 42b has its output connected between three-state buffer 41b and inter-chip wire 3b, and has its input connected to register 24b. Three-state buffers 41a, 41b are enabled when data is transferred from chip 1 to chip 2, while three-state buffers 42a, 42b are enabled when the test result of connection is transmitted.

Accordingly, when the test results held in registers 24a, 24b in chip 2 are transferred to chip 1, three-state buffers 32a, 32b, 42a, and 42b are enabled, and three-state buffers 31a, 31b, 41a, and 41b are disabled. As a result, the test result held in register 24a in chip 2 is transmitted through three-state buffer 42a, inter-chip wire 3a, and three-state buffer 32a to register 14a and held therein. Similarly, the test result held in register 24b in chip 2 is transmitted through three-state buffer 42b, inter-chip wire 3b, and three-state buffer 32b to register 14b and held therein.

Eighth Exemplary Embodiment

Figure 19:
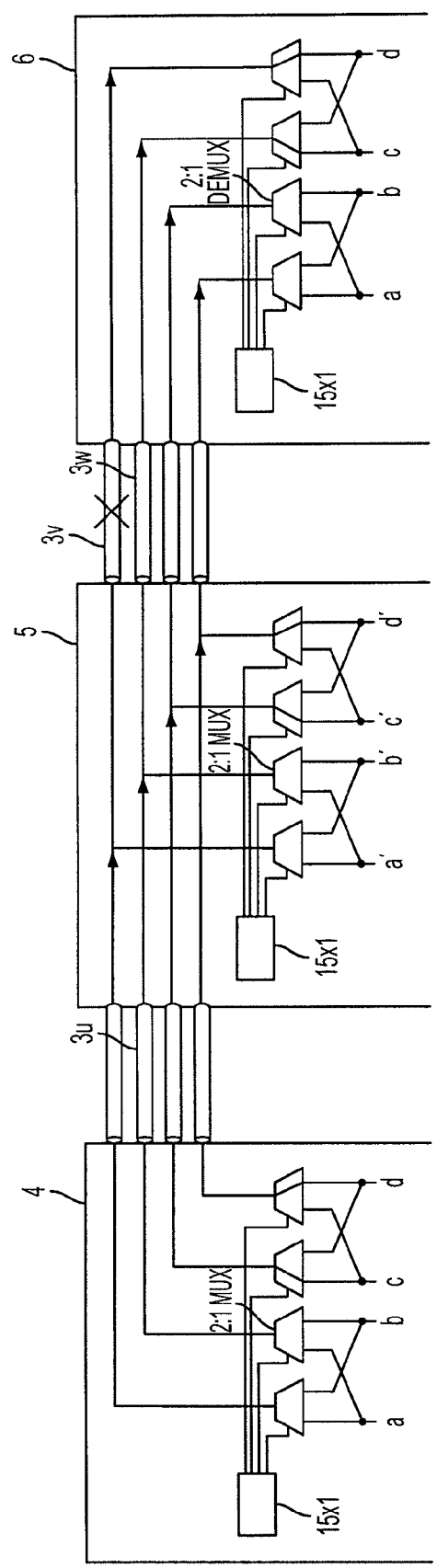
FIG. 19 is a schematic diagram of a semiconductor device according to an eighth exemplary embodiment of the present invention, where three semiconductor chips share a bus using inter-chip wires.

FIG. 19 is a schematic diagram of a semiconductor device wherein three semiconductor chips share a bus using inter-chip wires. Data is transmitted from chip 4 or chip 5 to chip 6 through the shared 4-bit bus. In this case, since a clock frequency used in inter-chip data transfer is 100 MHz, a bandwidth between chip 4 and chip 6 or between chip 4 and chip 5 is 400 Mbps. If among inter-chip wires from chip 5 to chip 6, inter-chip wire 3v for transferring data a' have a faulty connection, not only a transfer of data a' in chip 5 but also transfer of data in chip 4 to chip 6 cannot be normally performed because the inter-chip wires are shared. To deal with this problem, data transfer from chip 5 to chip 6 is performed by doubling the data transfer speed of the data transfer of data b' in chip 5 through inter-chip wire 3w, and at the same time a data transfer from chip 4 to chip 6 is performed by doubling the data transfer speed of the data transfer of data b in chip 4 through inter-chip wire 3u. In this way, a bandwidth of 400 Mpbs can be maintained.

Operations of switching the data transfer speed of the reception buffer circuits and transmission buffer circuits are as follows: A test of connection of inter-chip wires that are shared by chip 4, chip 5, and chip 6 is conducted by transferring the test result from chip 4 to chip 6, and the test result are held in the registers in chip 6 connected to respective inter-chip wires. Thereafter, the test results are delivered to the registers in chip 4 and to the registers in chip 5 in a register chain scan manner. Based on the information delivered to the registers, transfer speed control unit 15x1 switches the data transfer speed to the double speed of a transmission buffer circuit associated with an inter-chip wire adjacent to the inter-chip wire which has a faulty connection.

In this exemplary embodiment, three semiconductor chips shared a bus structure, but a similar configuration can be applied to a semiconductor device wherein four or more semiconductor chips shared a common bus structure.

Ninth Exemplary Embodiment

Figure 20:
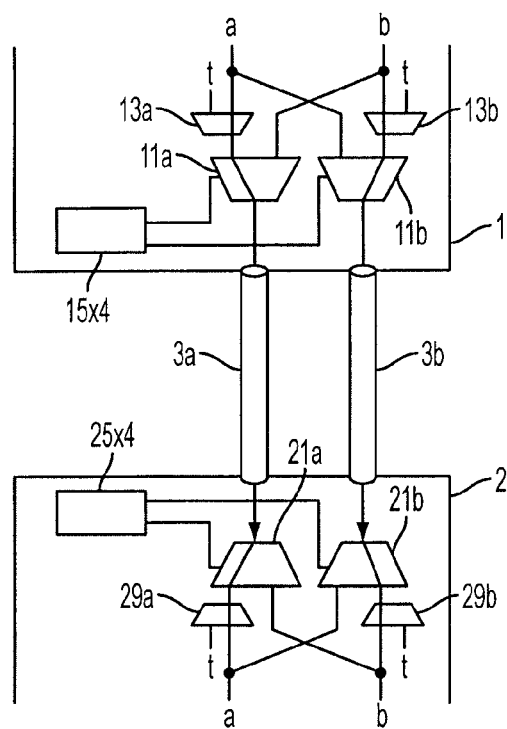
FIG. 20 is an explanatory diagram of a multi-chip semiconductor device according to a ninth exemplary embodiment of the present invention.
Figure 21:
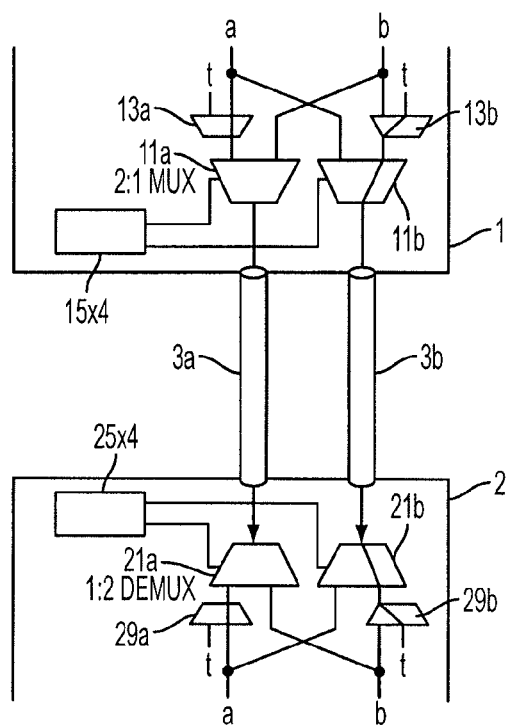
FIG. 21 is an explanatory diagram of the multi-chip semiconductor device according to the ninth exemplary embodiment of the present invention.

FIGS. 20, 21 are schematic diagrams of a semiconductor device according to a ninth exemplary embodiment of the present invention. In the semiconductor device, tests of connections of inter-chip wires are conducted in parallel therewith at the time of data communications. When a semiconductor device can be stopped, or an inter-chip data transfer in the semiconductor device can be paused, tests of connections of inter-chip wires can be conducted upon start-up of the semiconductor device or during stoppage of an inter-chip data transfer. However, there is a case where, as in a data center, semiconductor devices must be operated at all times, so that inter-chip data transfers cannot be paused. Thus, as shown in FIG. 21, when a connection test of inter-chip wire 3b is conducted, the data transfer speed through adjacent inter-chip wire 3a is doubled such that data which should otherwise be sent through inter-chip wire 3b, which is subjected to the connection test, is also transferred through adjacent inter-chip wire 3a. In this way, the connection test of an inter-chip wire can be conducted without reducing the bandwidth between the chips. Reference numerals 29a, 29b in FIGS. 20, 21 designate demultiplexers.

Figure 22:
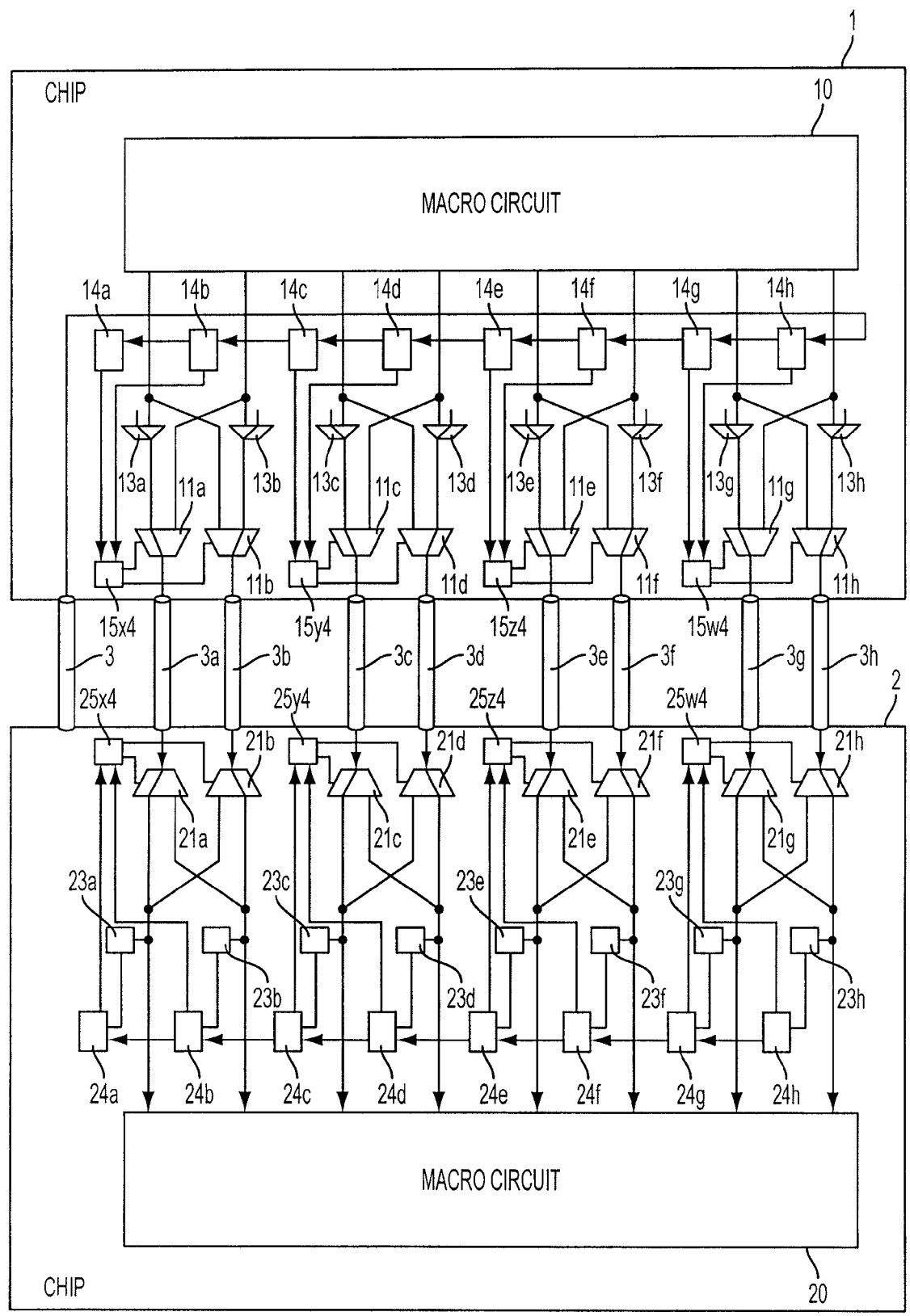
FIG. 22 is a block diagram of the multi-chip semiconductor device according to the ninth exemplary embodiment of the present invention.

FIG. 22 is a block diagram of a multi-chip semiconductor device of this exemplary embodiment.

Chip 1 includes macro circuit 10; transmission buffer circuits 11a, 11b, 11c, 11d, 11e, 11f, 11g, and 11h; selectors 13a, 13b, 13c, 13d, 13e, 13f, 13g, and 13h; registers 14a, 14b, 14c, 14d, 14e, 14f, 14g, and 14h; and transfer speed control units 15x4, 15y4, 15z4, and 15w4.

Chip 2 comprises macro circuit 20; reception buffer circuits 21a, 21b, 21c, 21d, 21e, 21f, 21g, and 21h; connection determination units 23a, 23b, 23c, 23d, 23e, 23f, 23g, and 23h; registers 24a, 24b, 24c, 24d, 24e, 24f, 24g, and 24h; and transfer speed control units 25x4, 25y4, 25z4, and 25w4. The same numerical designation as was used FIG. 1 is also used in FIG. 22 to designate elements that have the same functions.

Figure 23:
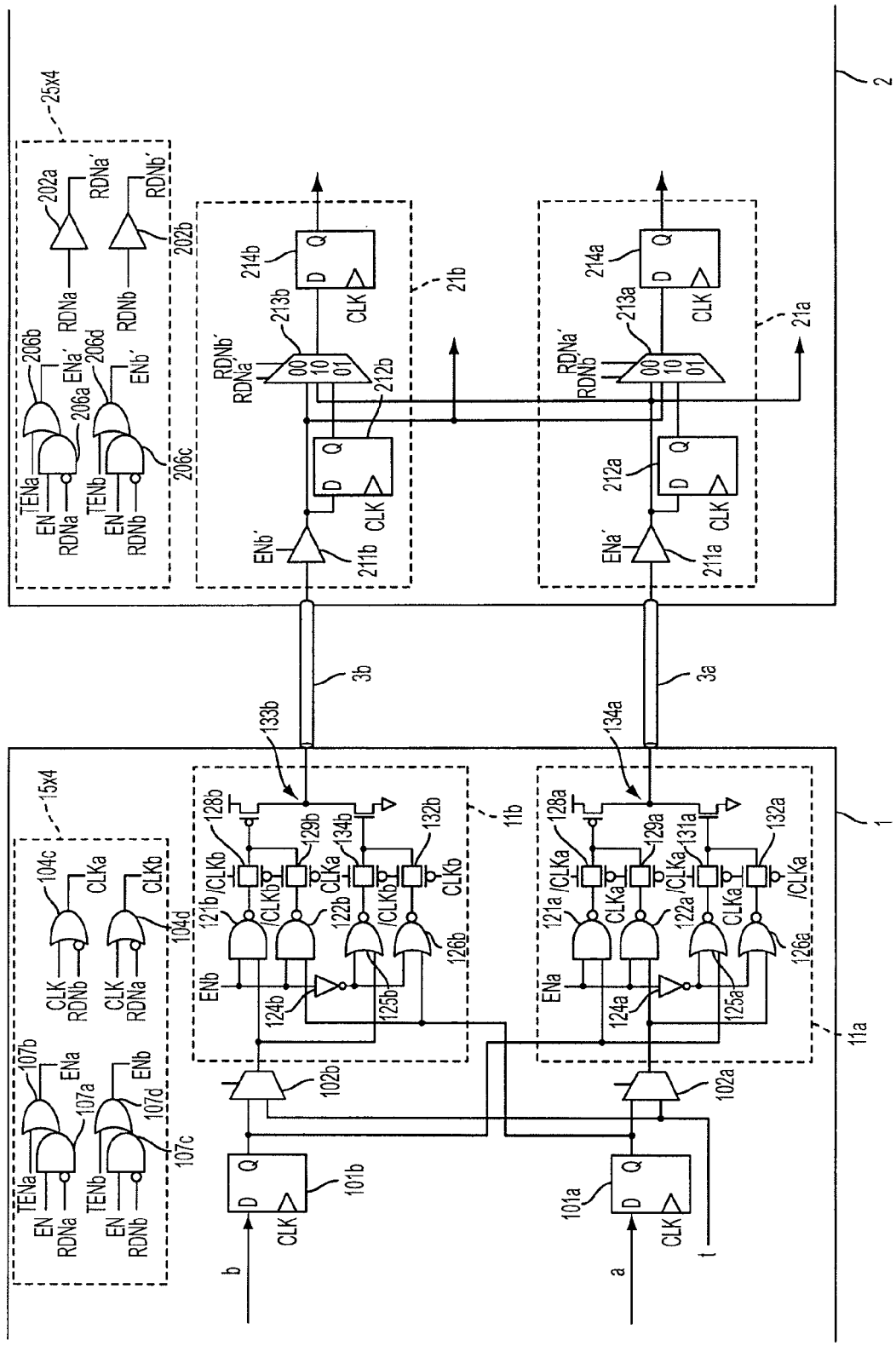
FIG. 23 is a detailed circuit diagram of the multi-chip semiconductor device of the ninth exemplary embodiment.

FIG. 23 is circuit diagrams of selectors 13a, 13b, transmission buffer circuits 11a, 11b, transfer speed control unit 15x4, reception buffer circuits 21a, 21b, and transfer speed control unit 25z4 in FIG. 22. The remaining selectors, transmission buffer circuits, transfer speed control units, and reception buffer circuits have configurations which are identical to them.

D flip-flop 101a and selector 102a make up selector 13a. D flip-flop 101b and selector 102b make up selector 13b. Transfer speed control unit 15x4 is made up of AND gates 107a, 107c, and OR gates 107b, 107d, 104c, and 104d. Signal EN to be applied to AND gates 107a, 107c is an enable signal which goes to a high level when data is transferred between chips 1 and 2. Signals TENa, TENb to be applied to OR gates 107b, 107d are enable signals which go to high-level signals when inter-chip wires 3a, 3b are tested, respectively. Signals RDNa, RDNb are signals that indicate the results of connection tests of inter-chip wires 3a, 3b, held in resisters 14a, 14b, respectively. Transmission buffer circuit 11a is made up of NAND gates 121a, 122a; inverter 124a; NOR gates 125a, 126a; transfer gates 128a, 129a, 131a, 132a; and CMOS inverter 134a. Similarly, transmission buffer circuit 11b is made up of NAND gates 121b, and 122b; inverter 124b; NOR gates 125b, 126b; transfer gates 128b, 129b, 131b, 132b; and CMOS inverter 134b. Operations of transmission buffer circuits 11a, 11b are similar to the operations of transmission buffer circuits 11c, 11d in FIG. 5.

Transfer control unit 25x4 is made up of AND gates 206a, 206c; OR gates 206b, 206d; and buffers 202a, 202b. Reception buffer circuit 21a is made up of three-state buffer 211a, D flip-flop 212a, selector 213a, and D flip-flop 214a. Reception buffer circuit 21b is made up of three-state buffer 211b, D flip-flop 212b, selector 213b, and D flip-flop 214b. Three-state buffer 211a is enabled and holds data therein from chip 1 when output ENa' of transfer control unit 25x4 is at a high level, i.e., while inter-chip wire 3a is being tested, and when inter-chip wire 3a has a good connection. Three-state buffer 211b is enabled and holds data therein from chip 1 when output ENb' of transfer control unit 25x4 is at a high level, i.e., while inter-chip wire 3b is being tested, and when inter-chip wire 3b has a good connection. The configurations of the other circuit elements are similar to those of the corresponding circuit elements in FIG. 5.

Tenth Exemplary Embodiment

Figure 24:
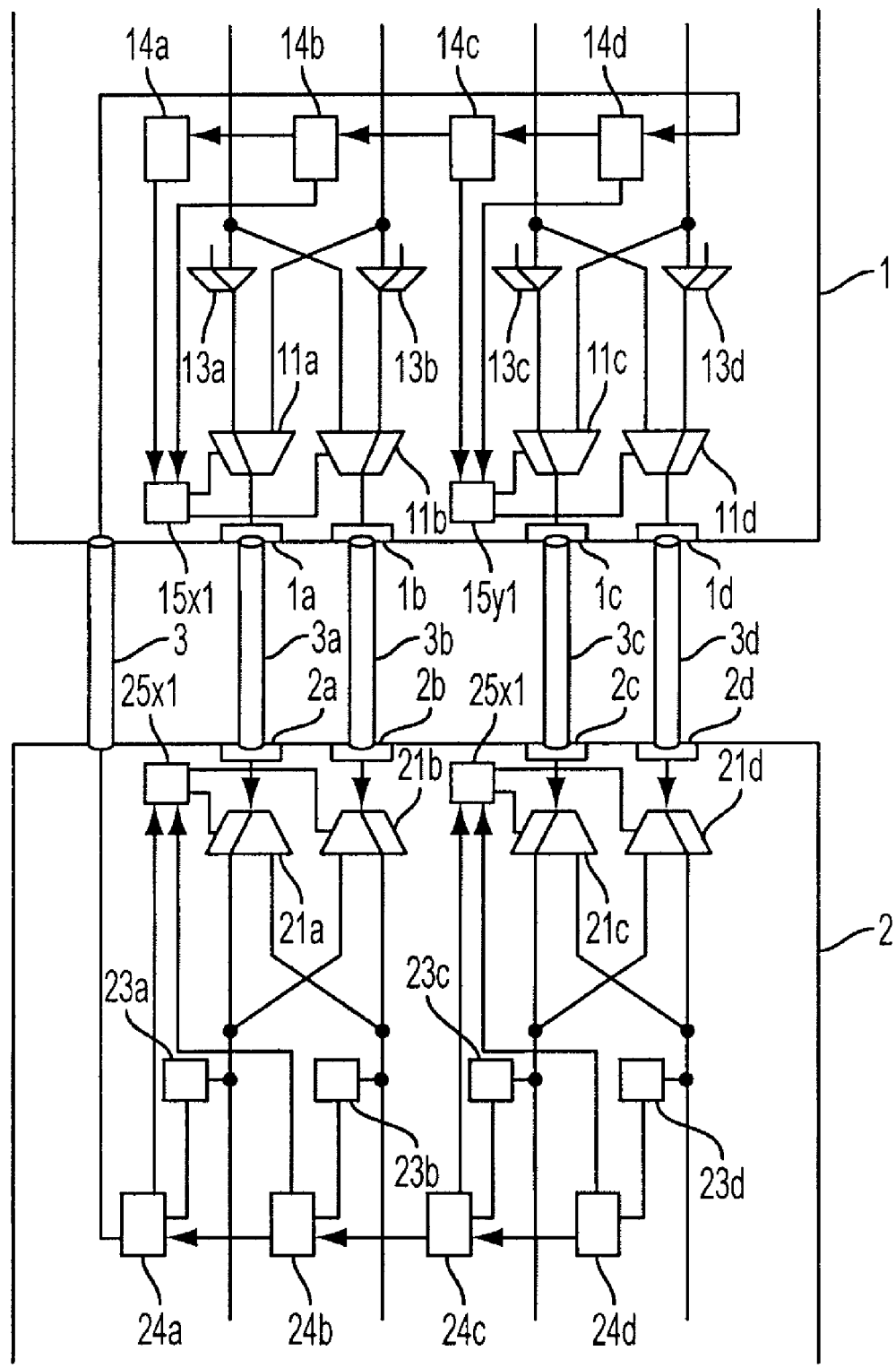
FIG. 24 is a block diagram of a multi-chip semiconductor device according to a tenth exemplary embodiment of the present invention.
Figure 25:
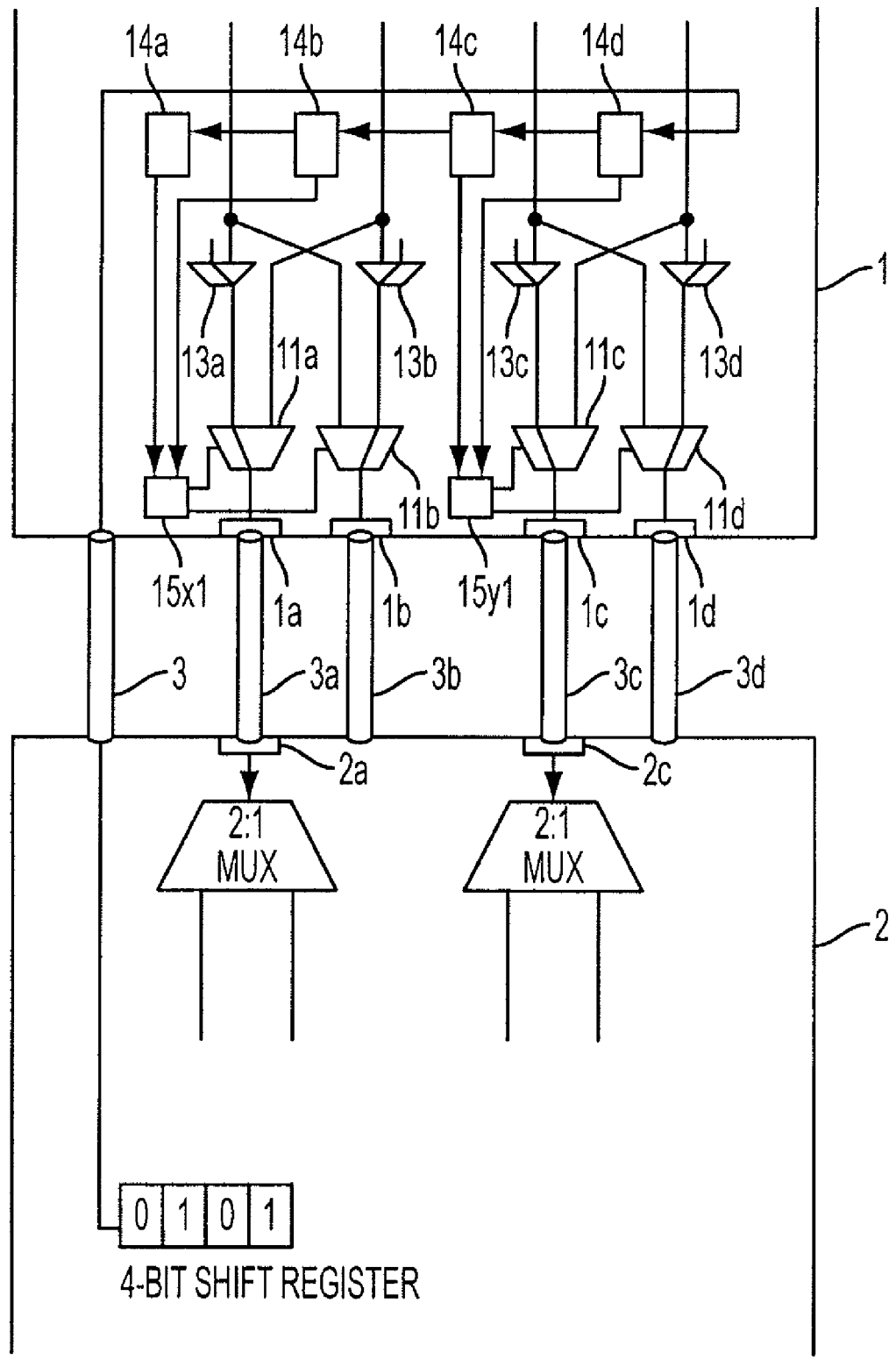
FIG. 25 is a block diagram of the multi-chop semiconductor device according to the tenth exemplary embodiment of the present invention.

FIG. 24 is a schematic diagram of a semiconductor device according to a tenth exemplary embodiment of the present invention. In this semiconductor device, when a plurality of chips are mounted to the semiconductor device, the number of terminals to be connected of the chips is recognized and the speed of data transfer through inter-chip wires is controlled in accordance with the number. As shown in FIG. 24, when the number of the terminals (1a-1d) of chip 1 on the transmission side is equal to the number of the terminals (2a-2d) of chip 2 on the reception side in a data communication performed therebetween, transmission buffer circuits 11a-11d in chip 1 and reception buffer circuits 21a-21d in chip 2 perform data transfer through inter-chip wires 3a-3d in synchronization with a clock. As shown in FIG. 25, when the number of the terminals of chip 2 is half the number of the terminals of chip 1, in order to transmit information on the number of the terminals of chip 2 from chip 2 to chip 1, a 4-bit shift register is provided in chip 2 and a pseudo test result is previously set to the register When the test result is transmitted, this register is scanned and the scanned pseudo result is transmitted to chip 1 where the data transfer speeds of transmission buffer circuits 11a and 11c in chip 1 associated with respective second and fourth inter-chip wires 3a, 3c are switched to the double speed. As a result, the bandwidth between the chips is not reduced. In order to control this switching of the data transfer speed, it is necessary to know the number of terminals of the counterpart chip. This can be achieved by the same method as determining whether connections of inter-chip wires are good or faulty, as described in the first exemplary embodiment. In FIG. 25, the number of the inter-chip wires is not half, but the number of the terminals of chip 2 is half the number of the terminals of chip 1. When the number of the inter-chip wires is half, control of switching of the data transfer speed is made possible by determining the number of inter-chip wires.

In this exemplary embodiment, the number of the terminals of chip 2 on the reception side is smaller than the number of the terminals of chip 1 on the transmission side. However, even in the opposite case where the number of the terminals of chip 1 on the transmission side is smaller than the number of the terminals of chip 2 on the reception side, similar effects can be achieved by switching the speed of data reception of chip 2 to a double speed.

While preferred exemplary embodiments of the present invention have been described using specific terms, such description is for illustrative purposes only, and it is to be understood that changes and variations may be made without departing from the spirit or scope of the following claims.

What is claimed is:

1. A method of transferring data in a multi-chip semiconductor device which comprises two or more semiconductor chips, and a plurality of inter-chip wires for transferring data between the semiconductor chips in synchronization with a clock signal, said method comprising:
    conducting a test to determine whether or not each inter-chip wire is capable of normally transferring data, on circuits arranged on chips between which said inter-chip wire is connected;
    when there exists an inter-chip wire which is incapable of normally transferring data, increasing the data transfer speed of a buffer circuit on a chip on a transmission side that is connected to an inter-chip wire which is capable of normally transferring data; and
    at said buffer circuit, transferring data to be transferred through the inter-chip wire which is incapable of normally transferring data, together with data to be transferred by said buffer circuit itself, at the increased data transfer speed to a chip on a reception side through the inter-chip wire which is connected to said buffer circuit.

2. The method according to claim 1, wherein said buffer circuit transfers data at both rising and falling edges of said clock signal.

3. The method according to claim 1, wherein said buffer circuit transfers data in synchronization with said clock signal and with one or more clock signals which are out of phase from said clock signal and which are generated from one or more clock signals which differ in frequency from said clock signal.

4. The method according to claim 1, wherein said buffer circuit transfers data in synchronization with said clock signal and with one or more clock signals which differ in phase from said clock signal.

5. The method according to claim 1, wherein said conducting a test to determine whether or not each inter-chip wire is capable of normally transferring data includes:
    transmitting a test signal having a predetermined pattern from a chip on the transmission side to a chip on reception side, and determining whether or not a test signal having said pattern has been received on the chip on the reception side.

6. The method according to claim 1, wherein said conducting a test to determine whether or not each inter-chip wire is capable of normally transferring data includes: doubling the data transfer speed of a buffer circuit on a chip on the transmission side which is connected to an inter-chip to be tested; transmitting test signals having different logical levels in sequence from the chip on the transmission side to the chip on the reception side; and converting received serial test signals to parallel signals through a 1:2 demultiplexing operation and exclusive NORing the parallel signals at the chip on the reception side.

7. The method according to claim 1, further comprising transmitting the result of said test as to whether or not each inter-chip wire is capable of normally transferring data, from the chip on the reception side to the chip on the transmission side chip using an inter-chip wire for the transmission of the result of said test.

8. The method according to claim 1, further comprising transmitting the result of said test as to whether or not each inter-chip wire is capable of normally transferring data, from the chip on the reception side to the chip on the transmission side using an inter-chip wire which is capable of normally transferring data.

9. The method according to claim 1, further comprising: when conducting said test to determine whether or not each inter-chip wire is capable of normally transferring data; limiting the number of inter-chip wires to be simultaneously tested; increasing the data transfer speed of a buffer circuit on the chip on the transmission side that is connected to an inter-chip wire which is not tested and which is performing a normal data transfer operation, during a test period; and transferring data to be transferred through an inter-chip wire which is to be tested, from said buffer circuit to the chip on the reception side through an inter-chip wire connected to said buffer circuit.

10. The method according to claim 1, further comprising: when interconnecting chips through inter-chip wires, checking the presence or absence of terminals of the chip on the transmission side to which the inter-chip wires are to be connected; and transferring data to be transferred through an inter-chip wire for which the chip on the transmission side has no terminal, through a buffer circuit connected to an inter-chip wire for which the chip on the transmission side has a terminal, at the increased data transfer speed.

11. The method according to claim 1, further comprising, at a buffer circuit on the chip on the reception side, demultiplexing data that has been transferred at the increased data transfer speed through an inter-chip wire which is capable of normally transferring data to parallel data at an original data transfer speed; and outputting the data to be transferred through an inter-chip wire which is incapable of normally transferring data, to a buffer circuit on the chip on the reception side that is connected to said inter-chip wire which is incapable of normally transferring data.

12. A multi-chip semiconductor device comprising:
    two or more semiconductor chips;
    a plurality of inter-chip wires through which data are transferred between the chips in synchronization with a clock signal;
    inter-chip wire testing means for conducting a test to determine whether or not each inter-chip wire is capable of normally transferring data;
    at least one buffer circuit on a chip on a transmission side and which is connected to an inter-chip wire, for transferring data to be transferred through the inter-chip wire to a chip on a reception side at a first data transfer speed in synchronization with said clock signal to the chip on the reception side, or for transferring said data to be transferred to the chip on the reception side through the inter-chip wire and data to be transferred to the chip on the reception side through another inter-chip wire at a second data transfer speed obtained by multiplying the first data transfer speed by the number of these data, to the chip on the reception side; and
    transfer speed control means for, when there exists an inter-chip wire incapable of normally transferring data, as a result of said test, switching the data transfer speed of said buffer circuit from the first data transfer speed to the second data transfer speed, and causing said buffer circuit to transfer data which cannot be transferred through the inter-chip wire to the chip on the reception side through the inter-chip wire connected to said buffer circuit.

13. The device according to claim 12, wherein said buffer circuit transfers data at both rising and falling edges of the clock signal.

14. The device according to claim 12, wherein said buffer circuit transfers data in synchronization with said clock signal and with one or more clock signals which are out of phase from said clock signal and which are generated from one or more clock signals which differ in frequency from said clock signal.

15. The device according to claim 12, wherein said buffer circuit transfers data in synchronization with said data and with one or more clock signals which differ in phase from said clock signal.

16. The device according to claim 12, further comprising:
first test result holding registers on the chip on the reception side each associated with each inter-chip wire for holding the result of said test as to whether or not each inter-chip wire is capable of normally transferring data;
second test result holding registers on the chip on the transmission side each associated with each first test result holding register for holding the result of said test as to whether or not each inter-chip wire is capable of normally transferring data; and
a test result transmission inter-chip wire for transmitting the results of said test held in said first test result holding registers to said second test result holding registers.

17. The device according to claim 16, further comprising:
a first three-state buffer having its input connected to an output of each buffer circuit on the chip on the transmission side for transferring data to the chip on the reception side through an inter-chip wire associated with said buffer circuit; and having its output connected to an input of the inter-chip wire;
a second three-state buffer having its input connected to the input of said inter-chip wire, and having its output connected to said second test result holding register associated with said inter-chip wire;
a third three-state buffer having its output connected to an input of a buffer circuit on the chip on the reception side for receiving data transferred from the buffer circuit on the chip on the transmission side through said inter-chip wire, and having its input connected to an output of said inter-chip wire; and
a fourth three-state buffer having its input connected to said first test result holding register associated with said inter-chip wire, and having its output connected to the output of said inter-chip wire,
wherein, when the result held in said first test result holding register is transmitted to said second test result holding register, said second and fourth three-state buffers are enabled, and said first and third three-state buffers are disabled whereby the result held in said first test result holding register is transmitted to said second test result holding register through said fourth three-state buffer, said inter-chip wire and said second three-three state buffer.

18. The device according to claim 16, wherein said transfer speed control means controls the data transfer speed of said buffer circuit using data held in said second test result holding register.

19. The device according to claim 12, wherein when an inter-chip wire other than an inter-chip wire connected to said buffer circuit is being tested to determine whether or not the inter-chip wire is capable of normally transferring data, said buffer circuit transfers data to be transferred through the inter-chip wire being tested to the chip on the reception side through the inter-chip wire connected to said buffer circuit at the increased data transfer speed.

20. The device according to claim 12, further comprising:
a selector for selecting data to be transferred through each inter-chip wire or a test signal for conducting a test to determine whether or not said inter-chip wire is capable of normally transferring data,
wherein on the chip on the transmission side, a buffer circuit connected to an odd-numbered inter-chip wire and a buffer circuit connected to an even-numbered inter-chip and adjacent to said inter-chip wire form a pair, and each buffer circuit receives an output of said selector corresponding to the inter-chip wire connected to said buffer circuit, and receives data to be transferred through an inter-chip wire connected to the buffer circuit paired with said buffer circuit.

21. The device according to claim 12, further comprising:
a first selector for selecting data to be transferred through each inter-chip wire or a test signal for conducting a test to determine whether or not said inter-chip wire is capable of normally transferring data; and
a second selector for selecting one of data to be transferred through two or more inter-chip wires other than the inter-chip wire connected to said buffer circuit,
wherein said buffer circuit receives the output of said first selector corresponding to the inter-chip wire connected to said buffer circuit, and the output of said second selector.

22. The device according to claim 12, further comprising:
a selector for selecting data to be transferred through each inter-chip wire or a test signal for conducting a test to determine whether or not said inter-chip wire is capable of normally transferring data,
wherein said buffer circuit receives the output of said selector corresponding to the inter-chip wire connected to said buffer circuit, and data to be transferred through two or more inter-chip wires other than the inter-chip wire connected to said buffer circuit.

23. The device according to claim 20, wherein on the chip on the reception side, similarly to the chip on the transmission side, a buffer circuit connected to an odd-numbered inter-chip wire and a buffer circuit connected to an even-numbered inter-chip wire and adjacent to said inter-chip wire form a pair, and each buffer circuit outputs from its first output data transferred through the inter-chip wire connected to said buffer circuit itself at said first data transfer speed, and outputs from its first and second output said data transferred through the inter-chip wire connected to said buffer circuit itself at said second transfer speed, and data to be transferred through an inter-chip wire adjacent to the inter-chip wire connected to said buffer circuit itself, respectively, in parallel with each other at said first data transfer speed.

24. The device according to claim 21, wherein on the chip on the reception side, a buffer circuit connected to the inter-chip wire connected to said buffer circuit on the chip on the transmission side outputs data to be transferred through the inter-chip wire, which has been transferred through the inter-chip wire at said first data transfer speed, from its first output, and outputs said data to be transferred through the inter-chip wire, and data selected by said second selector, which has been transferred, at said second data transfer speed, from its first and second output, respectively, in parallel with each other at said first data transfer speed, and a buffer circuit on the chip on the reception side connected to each of two or more inter-chip wires other than the inter-chip wire connected to said buffer circuit on the chip on the transmission side selects data transferred through the inter-chip wire connected to the buffer circuit itself when said inter-chip wire is normal, and selects and outputs the data output from the second output of said buffer circuit connected to the inter-chip wire connected to said buffer circuit on the chip on the transmission side when said inter-chip wire is faulty.

25. The device according to claim 22, wherein on the chip on the reception side, a buffer circuit connected to the inter-chip wire connected to said buffer circuit on the chip on the transmission side outputs data to be transferred through the inter-chip wire, which has been transferred through the inter-chip wire at said first data transfer speed, from its first output, and outputs said data to be transferred through the inter-chip wire and other data transferred, at said second data transfer speed, from its first and second output, respectively, in parallel with each other at said first data transfer speed, the number of the second output being equal to the number of two or more inter-chip wires other than the inter-chip wire connected to said buffer circuit on the chip on the transmission side, and a buffer circuit on the chip on the reception side connected to each of the two or more inter-chip wires other than the inter-chip wire connected to said buffer circuit on the chip on the transmission side selects said data transferred through the inter-chip wire connected to the buffer circuit itself when said inter-chip wire is normal, and selects and outputs data output from the corresponding second output of said buffer circuit connected to the inter-chip wire connected to said buffer circuit on the chip on the transmission side when said inter-chip wire is faulty.

* * * * *